(12) United States Patent
Lee et al.

(10) Patent No.: US 8,476,713 B2
(45) Date of Patent: Jul. 2, 2013

(54) VERTICAL-TYPE SEMICONDUCTOR DEVICE AND METHOD OF MANUFACTURING THE SAME

(75) Inventors: Seung-Jun Lee, Suwon-si (KR); Woonkyung Lee, Seongnam-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 764 days.

(21) Appl. No.: 12/588,270

(22) Filed: Oct. 9, 2009

(65) Prior Publication Data

US 2010/0090286 A1    Apr. 15, 2010

(30) Foreign Application Priority Data

Oct. 9, 2008    (KR) .................... 10-2008-0098896

(51) Int. Cl.
*H01L 21/70*    (2006.01)
*H01L 21/336*    (2006.01)

(52) U.S. Cl.
USPC ............ 257/368; 257/296; 257/E21.645; 257/E27.081; 438/197

(58) Field of Classification Search
USPC ............ 257/296, E27.081, 368; 438/197
See application file for complete search history.

(56) References Cited

U.S. PATENT DOCUMENTS

| | | | |
|---|---|---|---|
| 5,923,593 A * | 7/1999 | Hsu et al. .................. | 365/189.04 |
| 6,157,067 A | 12/2000 | Hsu et al. | |
| 6,391,736 B1 | 5/2002 | Uh et al. | |
| 6,551,895 B1 | 4/2003 | Hsu et al. | |
| 7,052,941 B2 | 5/2006 | Lee | |
| 2005/0280061 A1 | 12/2005 | Lee et al. | |
| 2007/0252201 A1 | 11/2007 | Kito et al. | |
| 2008/0106934 A1* | 5/2008 | Lee et al. .................. | 365/185.01 |
| 2008/0173928 A1* | 7/2008 | Arai et al. ..................... | 257/316 |
| 2008/0285344 A1* | 11/2008 | Ruttkowski et al. ...... | 365/185.05 |
| 2009/0059644 A1* | 3/2009 | Kajigaya ......................... | 365/72 |
| 2009/0072291 A1* | 3/2009 | Takaishi ......................... | 257/306 |
| 2009/0121271 A1 | 5/2009 | Son et al. | |
| 2009/0180324 A1* | 7/2009 | Ramaswamy et al. ... | 365/185.17 |
| 2009/0230450 A1* | 9/2009 | Shiino et al. .................. | 257/314 |

FOREIGN PATENT DOCUMENTS

| | | |
|---|---|---|
| JP | 06-338602 A | 12/1994 |
| KR | 10-2000-0052484 A | 8/2000 |
| KR | 10-2001-0045595 A | 6/2001 |
| KR | 10-2005-0072168 A | 7/2005 |

OTHER PUBLICATIONS

Fukuzumi, et al., "Optimal Integration and Characteristics of Vertical Array Devices for Ultra-High Density, Bit-Cost Scalable Flash Memory", Electron Devices Meeting, 2007, IEDM 2007, IEEE International, pp. 449-452 (2007).

Tanaka, et al., "Bit Cost Scalable Technology with Punch and Plug Process for Ultra High Density Flash Memory", Symposium on VLSI Technology Digest of Technical Papers, pp. 14-15 (2007).

* cited by examiner

*Primary Examiner* — Robert J Hoffberg
*Assistant Examiner* — Igwe U Anya
(74) *Attorney, Agent, or Firm* — Lee & Morse, P.C.

(57) ABSTRACT

A vertical-type semiconductor device includes a semiconductor substrate having a cell region and a peripheral circuit region, a wordline structure on the cell region of the semiconductor substrate, the wordline structure including a plurality of wordlines stacked on top of each other, a semiconductor structure through the wordline structure, a gate dielectric between the wordline structure and the semiconductor structure, and a dummy wordline structure on the peripheral circuit region, the dummy wordline structure having a vertical structure and including same components as the wordline structure.

18 Claims, 18 Drawing Sheets

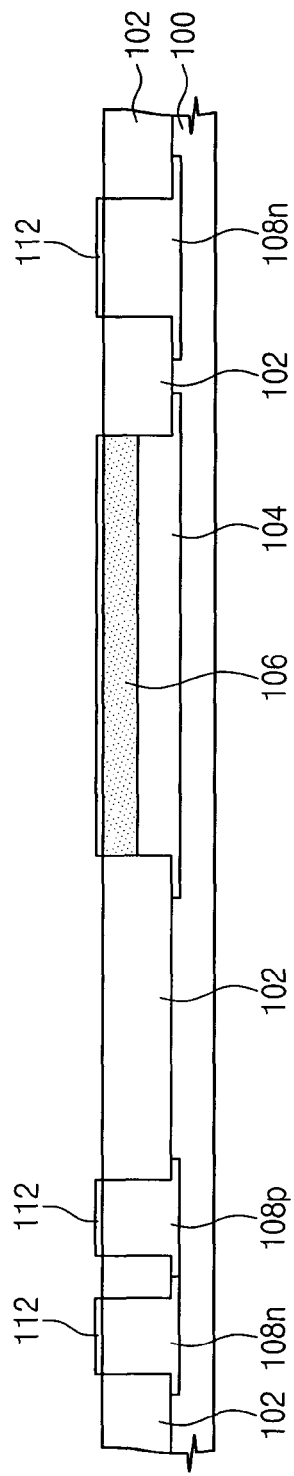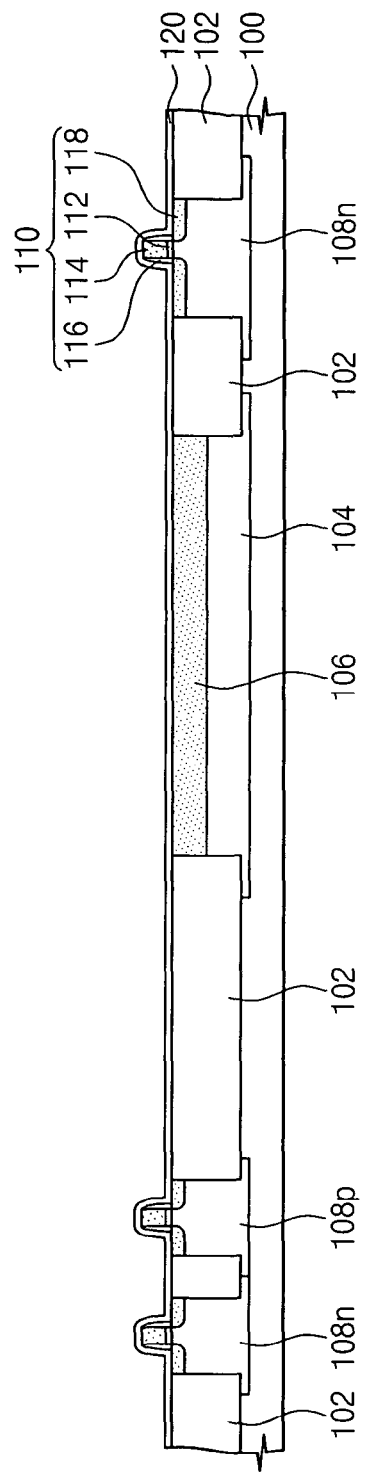

VERTICAL-TYPE SEMICONDUCTOR DEVICE AND METHOD OF MANUFACTURING THE SAME

BACKGROUND

1. Field

Example embodiments relate to a semiconductor device and a method of manufacturing the same. More particularly, example embodiments relate to a vertical-type semiconductor device and a method of manufacturing the same.

2. Description of the Related Art

In order to satisfy superior performance and inexpensive prices in semiconductor devices, an increased degree of integration of semiconductor devices may be required. In case of memory semiconductor devices, since a degree of integration is a key factor determining a price of a product, highly integrated semiconductor devices may be required.

In case of typical two-dimensional or planar memory semiconductor devices, since a degree of integration thereof is related to an area occupied by a unit memory cell, integration may be affected by fine pattern formation technologies. However, formation of fine patterns may require very high-priced devices, thereby limiting a degree of integration thereof.

Technologies for manufacturing three-dimensional memory cells, e.g., three-dimensional memory semiconductor devices that use vertical semiconductor pillars as an active region, have been proposed to efficiently utilize an area of a semiconductor substrate. As a result, a degree of integration of a three-dimensional memory cell may significantly increase when compared to a typical two-dimensional planar type memory semiconductor device.

SUMMARY

Embodiments are therefore directed to a vertical-type semiconductor device and a method of manufacturing the same, which substantially overcome one or more of the problems due to the limitations and disadvantages of the related art.

It is therefore a feature of an embodiment to provide a vertical-type semiconductor device with a dummy wordline structure to facilitate planarization of the semiconductor device.

It is therefore another feature of an embodiment to provide a vertical-type semiconductor device with a dampproofing structure within a dummy wordline structure to minimize moisture and contamination in the semiconductor device.

It is yet another feature of an embodiment to provide a method of manufacturing a vertical-type semiconductor device with one or more of the above features.

At least one of the above and other features and advantages may be realized by providing a vertical-type semiconductor device, including a semiconductor substrate having a cell region and a peripheral circuit region, a wordline structure in which a plurality of wordlines is vertically stacked on the cell region, a semiconductor structure passing through the wordline structure, a gate dielectric disposed between the wordline structure and the semiconductor structure, and a dummy wordline structure having a vertical structure equal to that of the wordline structure in the peripheral circuit region.

In some embodiments, the dummy wordline structure may have a top surface having the same height as that of a top surface of the wordline structure. The dummy wordline structure and the wordline structure may have a substantially same height along a vertical direction.

In other embodiments, the vertical-type semiconductor devices may further include a damp proofing structure passing through the dummy wordline structure.

In still other embodiments, the dampproofing structure may be disposed within a through hole passing through the dummy wordline structure.

In even other embodiments, the dampproofing structure may include a silicon nitride layer.

In yet other embodiments, the vertical-type semiconductor devices may further include a string select line structure disposed on the wordline structure, and a dummy string select line structure disposed on the dummy wordline structure, wherein the string select line structure may have a top surface having the same height as that of a top surface of the dummy string select line structure.

In further embodiments, the dummy wordline structure may be disposed at an edge portion of the peripheral circuit region. The dummy wordline structure may surround the cell region.

In still further embodiments, the vertical-type semiconductor devices may further include a ground select structure disposed between the wordline structure and the semiconductor substrate.

In even further embodiments, the wordline structure may have a stepped shape.

In yet further embodiments, the wordline structure, the semiconductor structure, and the gate dielectric may constitute a vertical-type NAND flash memory connected in series.

At least one of the above and other features and advantages may also be realized by providing a method for manufacturing a vertical-type semiconductor device, including forming a plurality of wordline conductive layers having a stacked structure in a cell region and a peripheral circuit region of a semiconductor substrate; patterning the wordline conductive layers of the cell region to form a wordline structure; patterning the wordline conductive layers of the peripheral circuit region to form a dummy wordline structure; forming a semiconductor structure passing through the wordline structure; and forming a gate dielectric between the wordline structure and the semiconductor structure.

In some embodiments, the methods for manufacturing the vertical-type semiconductor device may further include forming a dampproofing structure passing through the dummy wordline structure.

In other embodiments, the dampproofing structure may include a silicon nitride layer.

BRIEF DESCRIPTION OF THE DRAWINGS

The above and other features and advantages will become more apparent to those of ordinary skill in the art by describing in detail exemplary embodiments with reference to the attached drawings, in which.

DETAILED DESCRIPTION

Figure 1:
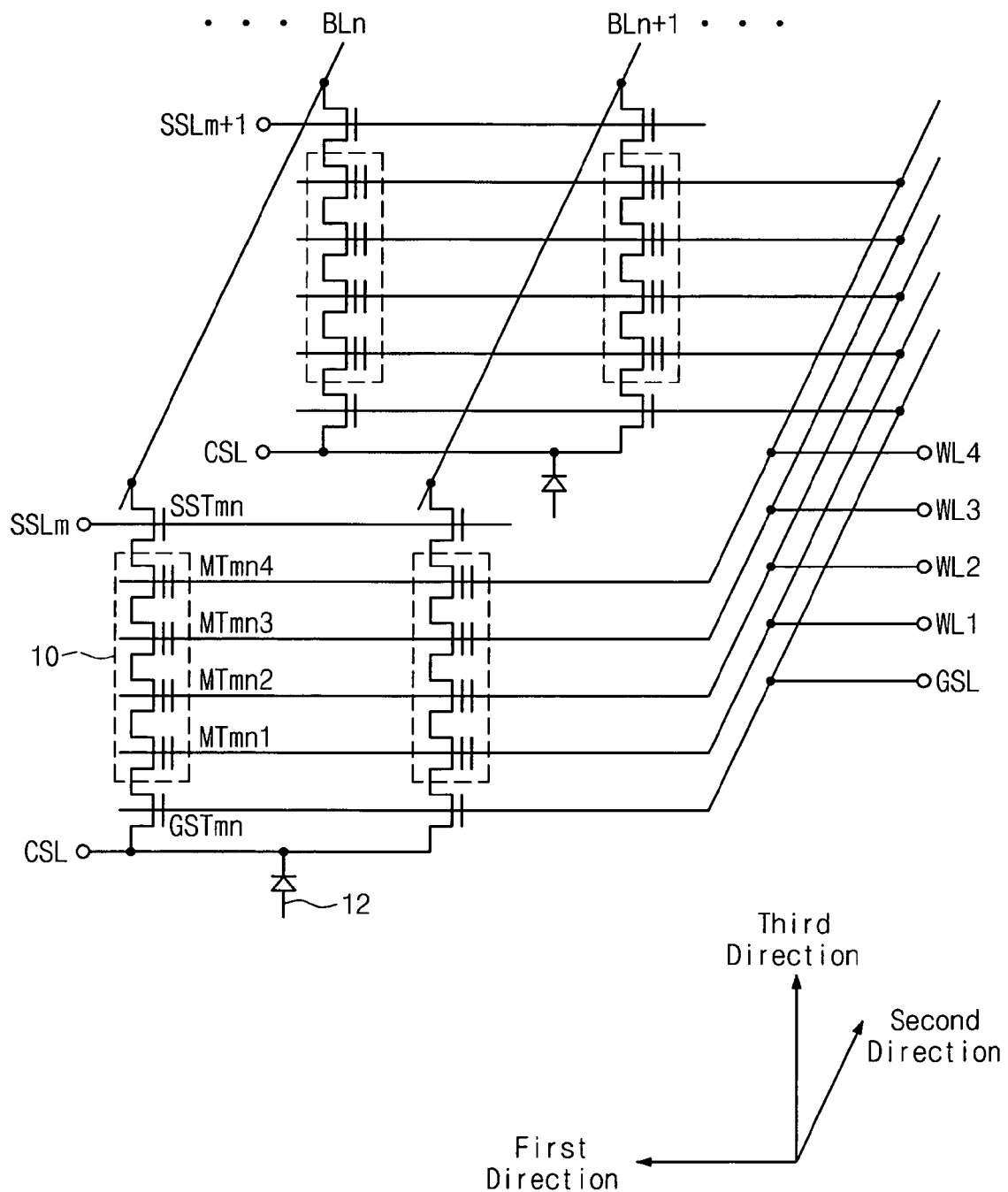
FIG. 1 illustrates a circuit diagram of a vertical-type semiconductor device according to an embodiment.

Korean Patent Application No. 10-2008-0098896, filed on Oct. 9, 2008, in the Korean Intellectual Property Office, and entitled: "Vertical-Type Semiconductor Device and Method of Manufacturing the Same," is incorporated by reference herein in its entirety.

A vertical-type semiconductor device according to example embodiments may have a highly stacked structure that includes vertical semiconductor pillars through stacked wordlines. Further, the vertical-type semiconductor device according to example embodiments may include a dummy wordline structure disposed in a peripheral circuit, e.g., around the highly stacked structure, so subsequent planarization and interconnection processes of the highly stacked structure may be substantially facilitated. In other words, a high degree of difficulty of the conventional planarization and interconnection processes of the highly stacked structure may be eliminated by using the dummy wordline structure according to example embodiments.

In addition, the vertical-type semiconductor device according to example embodiments may include a dampproofing structure disposed at an outermost portion of a chip. The dampproofing structure may protect the semiconductor device, i.e., the highly stacked structure, from moisture and/or contamination introduced from the outside of the semiconductor device. According to embodiments, the dampproofing structure may be disposed within the dummy wordline structure.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. In addition, it will also be understood that when a layer is referred to as being "between" two layers, it can be the only layer between the two layers, or one or more intervening layers may also be present. Further, though terms like a first, a second, and a third are used to describe various regions and layers in various embodiments of the present invention, the regions and the layers are not limited to these terms. These terms are used only to discriminate one region or layer from another region or layer. Therefore, a layer referred to as a first layer in one embodiment can be referred to as a second layer in another embodiment. An embodiment described and exemplified herein includes a complementary embodiment thereof. Like reference numerals refer to like elements throughout.

FIG. 1 illustrates a circuit diagram of a vertical-type semiconductor device according to an embodiment.

Referring to FIG. 1, a vertical-type semiconductor device according to an embodiment may include a plurality of stacked wordlines. For example, as illustrated in FIG. 1, a plurality of wordlines WL1 through WL4 may be stacked sequentially on top of each other along a vertical direction. For example, each of the wordlines WL1 through WL4 may extend in a plane defined by first and second directions to have a plate shape. Adjacent wordlines, i.e., along the vertical direction, may be separated from each other through wordline dielectric patterns, as will be discussed in more detail below with reference to FIGS. 2A and 2B. The wordlines WL1 through WL4 and the wordline dielectric patterns therebetween may define a wordline structures, as will be discussed in more detail below with reference to FIGS. 2A and 2B. The number of wordlines may be a multiple of two (2).

The vertical-type semiconductor device according to an embodiment may further include semiconductor structures and gate dielectric structures (not shown) disposed between respective semiconductor structures and wordline structures. The gate dielectric structure may include a charge storage layer. An intersection point of one wordline and one semiconductor structure may define one memory cell. The semiconductor structure may provide a channel region, a source region, and a drain region of the memory cell. For example, as illustrated in FIG. 1, the semiconductor structure may include a plurality of vertically and sequentially disposed memory cells, e.g., memory cells MTmn1 through MTmn4, connected to each other in series through the semiconductor structures. As illustrated in FIG. 1, the memory cells MTmn1 through MTmn4 connected in series may be disposed between respective ones of the wordlines WL1 through WL4, and may define a string 10.

As illustrated in FIG. 1, the string 10 may have a first end connected to a ground select transistor GSTmn and a second end connected to a string select transistor SSTmn. The string select transistor SSTmn may be electrically connected between the string 10 and a bitline BL. The ground select transistor GSTmn may include a ground select line GSL having a flat shape, a ground select semiconductor structure (not shown) passing through the ground select transistor GSTmn, and a ground select gate dielectric (not shown) disposed between the ground select semiconductor structure and the ground select line GSL. The ground select transistor GSTmn may be connected between the string 10 and a common source line CSL disposed on a semiconductor substrate. The common source line CSL may be connected to a diode 12. For example, one memory cell MTmn4 of the string 10 may be selected by one wordline WL4, one string select line SSLm, and one bitline BLn.

Figure 2A:
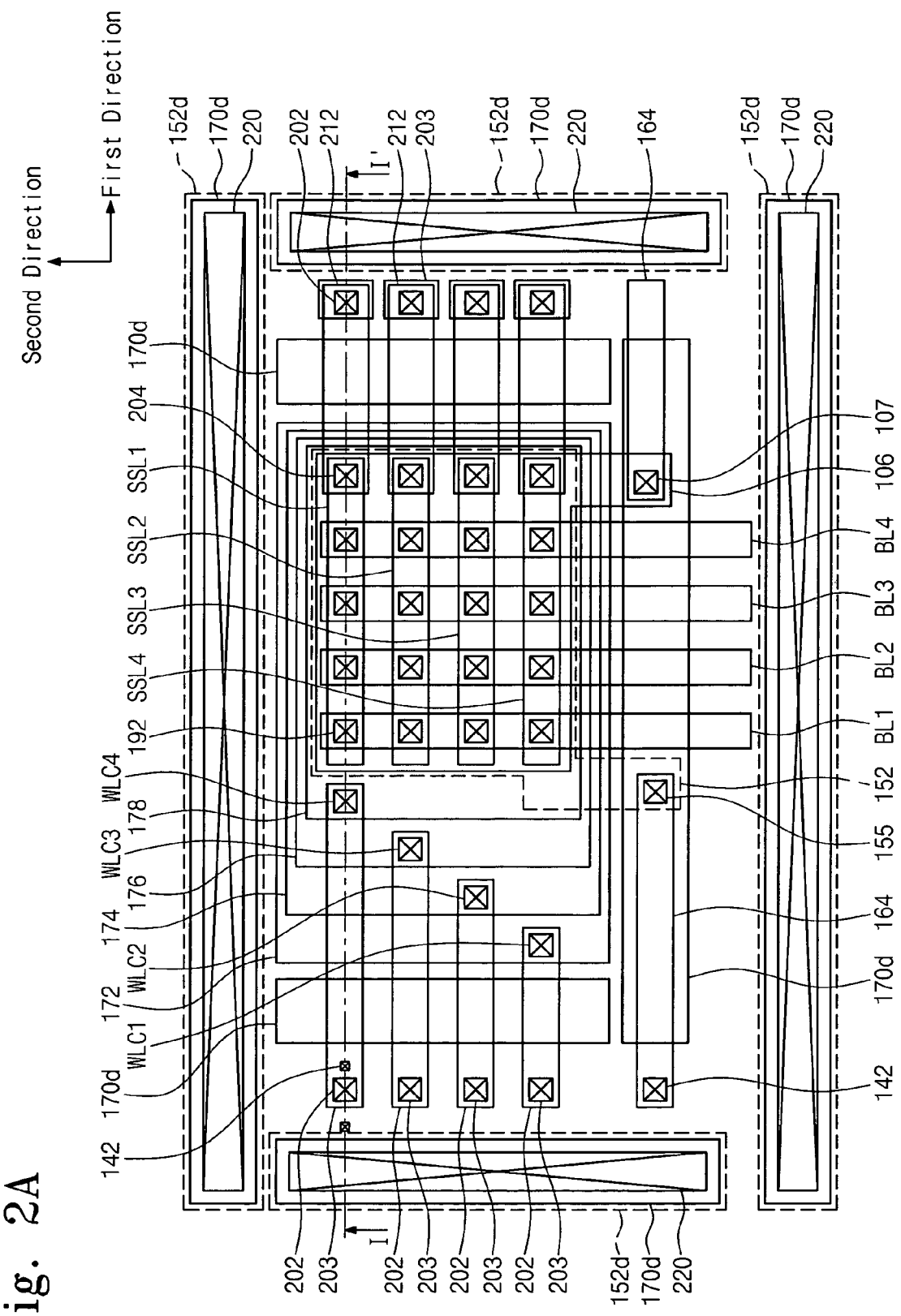
FIGS. 2A and 2B illustrate a plan view and a cross-sectional view, respectively, of a vertical-type semiconductor device according to an embodiment.
Figure 2B:
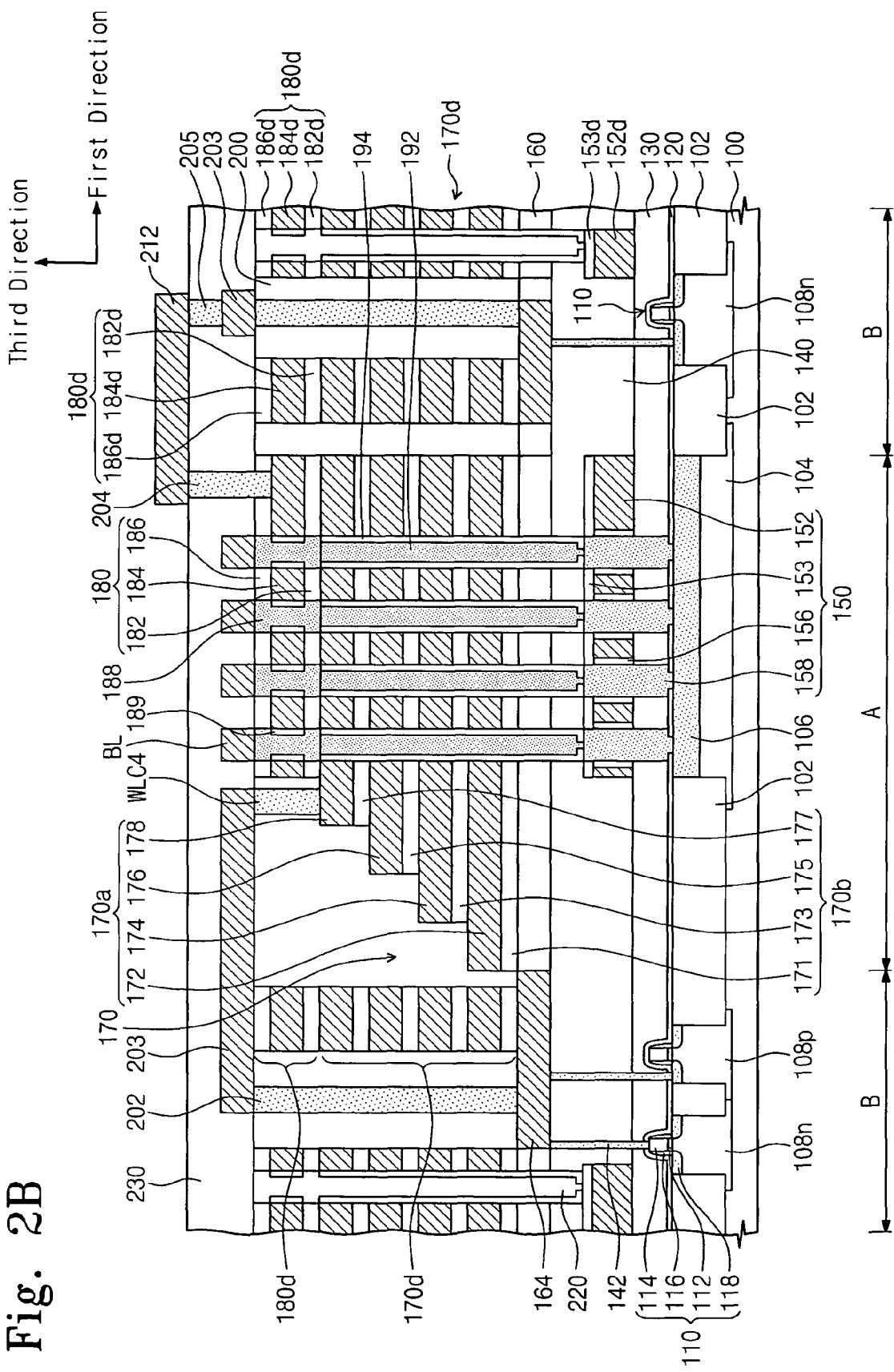

FIGS. 2A and 2B illustrate a plan view and a cross-sectional view, respectively, of a vertical-type semiconductor device according to an embodiment. FIG. 2B illustrates a cross-sectional view taken along line I-I' of FIG. 2A.

Referring to FIGS. 2A and 2B, a semiconductor substrate 100 may include a cell region A in which vertical type memory cells are disposed and a peripheral circuit region B in which a peripheral circuit for operating the vertical type memory cells is disposed. The cell region A of the semiconductor substrate 100 may be surrounded by a device isolation layer 102. Also, the device isolation layer 102 may be disposed in the peripheral circuit region B. The device isolation layer 102 may define an active region, i.e., the cell region A. A top surface of the device isolation layer 102 may have a substantially same height as the semiconductor substrate 100. A shallow trench isolation process may be performed to form the device isolation layer 102. The device isolation layer 102 may include, e.g., a silicon oxide layer.

P-type conductive impurities may be doped into the cell region A to form a P-well 104. An NMOS and/or PMOS may be disposed in the peripheral circuit region B. P-type conductive impurities may be doped into the peripheral circuit region B to form a P-well 108p, e.g., in a region including the NMOS, and N-type conductive impurities may be doped into the peripheral circuit region B to form an N-well 108*n*, e.g., in a region including the PMOS. A common source region 106 doped with N-type impurities may be defined on the P-well 104 of the cell region A. The common source region 106 may serve as a conductive layer. The common source region 106 may serve as a common source line, i.e., the common source line CSL in FIG. 1. For example, as illustrated in FIG. 2A, the common source region 106 may be disposed in a plate shape. The common source region 106 may be joined to the P-well 104 through a PN junction to form a diode.

A peripheral circuit gate structure 110 may be disposed in the peripheral circuit region B. The peripheral circuit gate structure 110 may include a peripheral circuit gate dielectric 112, a peripheral circuit gate electrode 114, a peripheral spacer 116, and a source/drain 118. For example, the peripheral circuit gate dielectric 112 may include a silicon oxide layer. In another example, the peripheral circuit gate dielectric 112 may include a high-voltage gate dielectric and a low-voltage gate dielectric. The high-voltage gate dielectric may have a thickness greater than that of the low-voltage gate dielectric.

The peripheral circuit gate electrode 114 may be formed, e.g., of doped silicon. The peripheral circuit gate electrode 114 may have a multi-layered structure. For example, the peripheral circuit gate electrode 114 may have a stacked structure of silicon/metal compound. The metal compound may include, e.g., metal silicide. The peripheral circuit spacer 116 may include, e.g., a silicon nitride layer. N-type or P-type impurities may be doped into the semiconductor substrate 100 disposed on both sides of the peripheral circuit gate electrode 114 to form the source/drain 118.

A first etch stop layer 120 may be disposed on the peripheral circuit gate structure 110 and the common source region 106. The first etch stop layer 120 may include, e.g., a silicon oxide layer. A first interlayer dielectric 130 may be disposed on the first etch stop layer 120. A top surface of the first interlayer dielectric 130 may be planarized. The first interlayer dielectric 130 may include, e.g., a silicon oxide layer.

A ground select structure 150 may be disposed on the first interlayer dielectric 130 of the cell region A, e.g., portions of the ground select structure 150 may be directly on the first interlayer dielectric 130 and the common source region 106. For example, the ground select structure 150 may include the ground select transistor GSTmn (refer to FIG. 1), e.g., the connection between the ground select transistor GSTmn and the common source line CSL in FIG. 1 may correspond to the connection between the ground select structure 150 and the common source region 106 in FIG. 2B. The ground select structure 150 may include a ground select line, a ground select semiconductor structure 158 passing through the ground select line 152, and a ground select gate dielectric 156 disposed between the ground select semiconductor structure 158 and the ground select line 152.

The ground select line 152 may be on, e.g., directly on, the common source region 106, and may be formed of a doped semiconductor material. For example, as illustrated in FIG. 2A, the ground select line 152 may have a plate shape, e.g., overlap a substantially large portion of the common source region 106. A second etch stop layer 153 may be disposed on the ground select line 152. The second etch stop layer 153 may include a silicon nitride layer. The second etch stop layer 153 and the ground select line 152 may be aligned with each other, e.g., completely overlap each other. The ground select semiconductor structure 158 may pass through the second etch stop layer 153, the ground select line 152, the first interlayer dielectric 130, and the first etch stop layer 120. For example, as illustrated in FIG. 2B, the ground select semiconductor structure 158 may include a plurality of columns extending vertically from the second etch stop layer 153 to contact, e.g., directly contact, the common source region 106. The ground select semiconductor structure 158 may be formed of a single crystal or poly crystal semiconductor material. The ground select semiconductor structure 158 may be doped. The ground select line 152, the ground select gate dielectric 156, and the ground select semiconductor structure 158 may constitute the vertical type ground select transistor GSTmn. The ground select semiconductor structure 158 may have one end contacting the common source region 106. The ground select semiconductor structure 158 may pass through the ground select line 152 and may be disposed in a matrix shape.

According to a modified embodiment, the ground select transistor GSTmn may be vertically or horizontally disposed on the semiconductor substrate 100. The vertical type ground select transistor may have a structure similar to that of the memory cell.

A dummy ground select line 152*d* may be disposed on the first interlayer dielectric 130 of the peripheral circuit region B. The dummy ground select line 152*d* may be formed of doped silicon. A second dummy ground etch stop pattern 153*d* may be disposed on the dummy ground select line 152*d*. The second dummy etch stop pattern 153*d* may include a silicon nitride layer. Lateral surfaces of the second dummy etch stop pattern 153*d* and the dummy ground select line 152*d* may be aligned with each other, e.g., the second dummy etch stop pattern 153*d* and dummy ground select line 152*d* may completely overlap each other. The second dummy etch stop pattern 153*d* may have a top surface having a substantially same height as that of a top surface of the second etch stop pattern 153, i.e., top surfaces of the second dummy etch stop pattern 153*d* and second etch stop pattern 153 may be substantially level. It is noted that "lateral surfaces" refer to surfaces extending between bottom surfaces, i.e., surfaces facing the substrate 100, and top surfaces, i.e., surfaces facing away from the substrate 100.

A second interlayer dielectric 140 may be disposed on the resultant structure including the dummy ground select line 152*d* and the ground select line 152. The second interlayer dielectric 140 may be disposed on the first interlayer dielectric 130, the second etch stop layer 153, and the second dummy etch stop layer 153*d*. A top surface of the second interlayer dielectric 140 may be planarized.

A lower contact plug 142 may pass through the second interlayer dielectric 140, the first interlayer dielectric 130 and the first etch stop layer 120, and may be connected to the peripheral circuit gate electrode 114 and/or the source/drain 118 of the peripheral circuit gate structure 110. As illustrated in FIG. 2A, a common source contact plug 107 may contact the common source region 106 of the cell region A, e.g., a portion of the common source region 106 not overlapping the ground select line 152. As further illustrated in FIG. 2A, a ground select contact plug 155 may contact the ground select line 152, e.g., a portion of the ground select line 152 not overlapping the common source region 106.

A lower interconnection 164 may be disposed on the lower contact plug 142, the common source contact plug 107, and/or the ground select contact plug 155. The lower interconnection 164 may be formed of a metal or a doped semiconductor material. Top surfaces of the lower contact plug 142, the common source contact plug 107, and/or the ground select contact plug 155 may have substantially same heights, i.e., may be substantially level.

As illustrated in FIG. 2A, the common source contact plug 107 may be disposed on the common source region 106 of the cell region A. Thus, as further illustrated in FIG. 2A, the common source region 106 (or the common source line CSL) may be electrically connected to the peripheral circuit region B through the common source contact plug 107 and the lower interconnection 164. A lateral surface of the lower interconnection 164 may be filled with a third interlayer dielectric 160, e.g., the third interlayer dielectric 160 may be disposed on the second interlayer dielectric 140 between adjacent portions of the lower interconnection 164. The third interlayer dielectric 160 may have a top surface having a same height as that of a top surface of the lower interconnection 164.

As illustrated in FIG. 2B, a wordline structure 170 may include a plurality of wordlines 170a with dielectric patterns 170b therebetween, and may be disposed on the third interlayer dielectric 160 in the cell region A. The wordline structure 170 may include a first wordline dielectric pattern 171, a first wordline 172, a second wordline dielectric pattern 173, a second wordline 174, a third wordline dielectric pattern 175, a third wordline 176, a fourth wordline dielectric pattern 177, and a fourth wordline 178, e.g., sequentially disposed on the third interlayer dielectric 160. At least a portion of the wordline structure 170 may have a stepped shape. Lateral surfaces of the first wordline dielectric pattern 171 and the first wordline 172 may be aligned with each other at the stepped portion. Lateral surfaces of the second wordline dielectric pattern 173 and the second wordline 174 may be aligned with each other at the stepped portion. Lateral surfaces of the third wordline dielectric pattern 175 and the third wordline 176 may be aligned with each other at the stepped portion. Lateral surfaces of the fourth wordline dielectric pattern 177 and the fourth wordline 178 may be aligned with each other at the stepped portion. The first through fourth wordline dielectric patterns 170b may include a silicon oxide layer. The first through fourth wordlines 170a may be formed of doped silicon. The wordlines 170a may have thicknesses thicker than those of the wordline dielectric patterns 170b. Each of the wordlines 170a may have a plate shape, as illustrated in FIG. 2A.

A semiconductor structure 192 passing through the wordline structure 170 may be provided. For example, the semiconductor structure 192 may include a plurality of columns, e.g., pillars disposed in a matrix shape, passing through a surface on which the wordline structure 170 is disposed, e.g., through the third interlayer dielectric 160 and a portion of the second interlayer dielectric 140. A gate dielectric 194 may be disposed between the semiconductor structure 192 and the wordline structure 170, e.g., along lateral surfaces of the columns of the semiconductor structure 192 between the semiconductor structure 192 and the wordlines 170a.

The gate dielectric 194 may include a charge storage layer. An intersection point of one wordline 170a and one semiconductor structure, i.e., one column of the semiconductor structure 192, may provide one memory cell. The semiconductor structure 192 may provide a channel region, a source region, and a drain region of the memory cell. The semiconductor structure 192 may have one end contacting the ground select semiconductor structure 158, e.g., the semiconductor structure 192 may correspond to a plurality of strings 10 in FIG. 1 that contact ground select transistors GSTmn. The semiconductor structure 192 may be formed of a single crystal or poly crystal semiconductor material.

According to a modified embodiment, the semiconductor structure 192 may have a cylindrical or macaroni shape. The inside of the cylindrical semiconductor structure 192 may be filled with a dielectric.

As illustrated in FIGS. 2A and 2B, a dummy wordline structure 170d may be disposed in the peripheral circuit region B. As illustrated in FIG. 2B, the dummy wordline structure 170d may have a vertical structure, e.g., extending vertically along a third direction, and may have a substantially same height as that of the wordline structure 170, e.g., top surfaces of the dummy wordline structure 170d and wordline structure 170 may be substantially level. The dummy wordline structure 170d may be disposed on the third interlayer dielectric 160 and/or the lower interconnection 164. For example, as illustrated in FIG. 2B, the dummy wordline structure 170d may include a first portion contacting, e.g., directly contacting, the third interlayer dielectric 160 and a second portion spaced apart from the first portion along the first direction and contacting, e.g., directly contacting, the lower interconnection 164. The dummy wordline structure 170d may include substantially same components as the wordline structure 170, and may not have a stepped structure.

As illustrated in FIG. 2A, the dummy wordline structure 170d may be disposed in the peripheral circuit region B around the cell region A. For example, the dummy wordline structure 170d may have a fence shape to surround, e.g., completely surround, the cell region A. For example, as illustrated in FIG. 2A, the dummy wordline structure 170d may include at least one portion extending along and overlapping each side of the cell region A. In another example, as further illustrated in FIG. 2A, the dummy wordline structure 170d may include two parallel portions spaced apart from each other and overlapping each side of the cell region A. The dummy wordline structure 170d may be disposed at an edge portion of the peripheral circuit region B, e.g., an edge portion of the peripheral circuit region B spaced apart from the cell region A.

As illustrated in FIG. 2B, a string select line structure 180 may be disposed on the wordline structure 170. The string select line structure 180 may include a string select dielectric pattern 182, a string select line 184, and a string select capping pattern 186. Lateral surfaces of the string select dielectric pattern 182, the string select line 184, and the string select capping pattern 186 may be aligned with each other. A string select semiconductor structure 188 may pass through the string select line structure 180. A string select gate dielectric 189 may be disposed between the string select semiconductor structure 188 and the string select line 184. A fifth interlayer dielectric (not shown) may be filled between the string select line 184 and the string select capping pattern 186, which are adjacent to each other. The fifth interlayer dielectric may have a top surface corresponding to that of the string select capping pattern 186.

The string select semiconductor structure 188 may have one end contacting the semiconductor structure 192 and the other end electrically connected to a bitline BL. The string select line 184, the string select gate dielectric 189, and the string select semiconductor structure 188 may constitute the string select transistor SSTmn (refer to FIG. 1). The string select lines 184, e.g., corresponding to SSLm in FIG. 1, may extend in a first direction, and adjacent string select lines 184 may be electrically separated from each other. The bitline BL may be patterned in a line shape to extend in a second direction crossing the first direction. The string select line 184 may be connected to an upper interconnection 212 through a string select contact plug 204.

A dummy string select line structure 180d may be disposed on the dummy wordline structure 170d in the peripheral circuit region B. The dummy string select line structure 180d may have a vertical structure, and may substantially have a same structure as that of the string select line structure 180. The dummy string select line structure 180d may include a dummy string select dielectric pattern 182d, a dummy string select line 184*d*, and a dummy string select capping pattern 186*d*. Lateral surfaces of the dummy string select dielectric pattern 182*d*, the dummy string select line 184*d*, and the dummy string select capping pattern 186*d* may be aligned with each other. Lateral surfaces of the dummy wordline structure 170*d* and the dummy string select line structure 180*d* may be aligned with each other, e.g., to form a substantially uniform surface in a plane defined by the second and third directions.

Lateral surfaces of the wordline structure 170 and the string select line structure 180, as well as lateral surfaces of the dummy wordline structure 170*d* and dummy string select line structure 180*d*, may be filled with a fourth interlayer dielectric 200. In other words, the fourth interlayer dielectric 200 may be disposed on the third interlayer dielectric 160 and on the lower interconnection 164 to fill spaces between vertical structures of the wordline structure 170, string select line structure 180, dummy wordline structure 170*d*, and dummy string select line structure 180*d*. For example, the fourth interlayer dielectric 200 may extend vertically on the stepped portion of the wordline structure 170. In another example, as illustrated in FIG. 2A, when the dummy wordline structure 170*d* includes two portions spaced apart from each other, the fourth interlayer dielectric 200 may extend therebetween.

The fourth interlayer dielectric 200 may have a top surface having the same height as that of a top surface of the string select line structure 180. Also, the fourth interlayer dielectric 200 may have a top surface having the same height as that of a top surface of the dummy string select line structure 180*d*. Since the dummy wordline structure 170*d* and/or the dummy string select line structure 180*d* extend to a substantially same height as the wordline structure 170 and/or the string select line structure 180, respectively, when a planarization process is performed on the fourth interlayer dielectric 200, the dummy wordline structure 170*d* and/or the dummy string select line structure 180*d* may serve as dummy patterns to facilitate formation of a substantially uniform and planar top surface of the fourth interlayer dielectric 200. In other words, formation of the dummy wordline structure 170*d* and/or the dummy string select line structure 180*d* may facilitate formation of a substantially planar top surface of the fourth interlayer dielectric 200, thereby ensuring that no height difference between the cell region A and the peripheral circuit region B exists.

A dampproofing structure 220 may be disposed within the dummy wordline structure 170*d* and the dummy string select line structure 180*d* of the peripheral circuit region B. For example, as illustrated in FIGS. 2A and 2B, the dummy wordline structure 170*d* may be disposed at an outermost portion of the peripheral circuit region B. The dampproofing structure 220 may pass through the dummy wordline structure 170*d*. For example, the dampproofing structure 220 may extend vertically through the dummy wordline structure 170*d* along the outermost portion of the peripheral circuit region B, so the dampproofing structure 220 may surround, e.g., completely surround, the cell region A. The dampproofing structure 220 may include, e.g., a silicon nitride layer. The dampproofing structure 220 may prevent or substantially minimize introduction of contaminating materials or moisture from an exterior of a chip into the peripheral circuit region B. The dampproofing structure 220 may extend to pass through the dummy string select line structure 180*d*. The dampproofing structure 220 may extend to pass through the third interlayer dielectric 160 and the second interlayer dielectric 140.

According to a modified embodiment, the dampproofing structure 220 may be disposed on an inner lateral surface of a through hole (not shown) passing through the dummy wordline structure 170*d*.

Wordline contact plugs, e.g., first through fourth wordline contact plugs WLC1, WLC2, WLC3, and WLC4, may be disposed through the planarized fourth interlayer dielectric 200. The wordline contact plugs WLC1, WLC2, WLC3, and WLC4 may be disposed along a lateral surface of the wordline structure 170 at the stepped portion. Each of the first through fourth wordline contact plugs WLC1, WLC2, WLC3, and WLC4 may pass through the fourth interlayer dielectric 200 to contact respective first through fourth wordlines 172, 174, 174, and 178. The first through fourth wordline contact plugs WLC1, WLC2, WLC3, and WLC4 may have top surfaces having the same height.

As illustrated in FIG. 2B, an upper interconnection contact plug 202 may pass through the fourth interlayer dielectric 200 in the peripheral circuit region B to contact the lower interconnection 164. The bitline BL may be disposed on the fourth interlayer dielectric 200, and may contact the string select semiconductor structure 188 in the cell region A. A metal pad 203 may be disposed flush with the bitline BL in the peripheral circuit region B. The metal pad 203 may be electrically connected to the wordline contact plugs WLC1, WLC2, WLC3, and WLC4 and/or the upper interconnection contact plug 202.

A sixth interlayer dielectric 230 covering the bitline BL and the metal pad 203 may be disposed. A string select contact plug 204 passing through the sixth interlayer dielectric 230 and the string select capping pattern 186 to contact the string select line 184 may be disposed. The string select contact plug 204 may be electrically connected to the peripheral circuit through an upper interconnection 212. The upper interconnection 212 may be electrically connected to the metal pad 203 through a via 205.

Figure 3C:
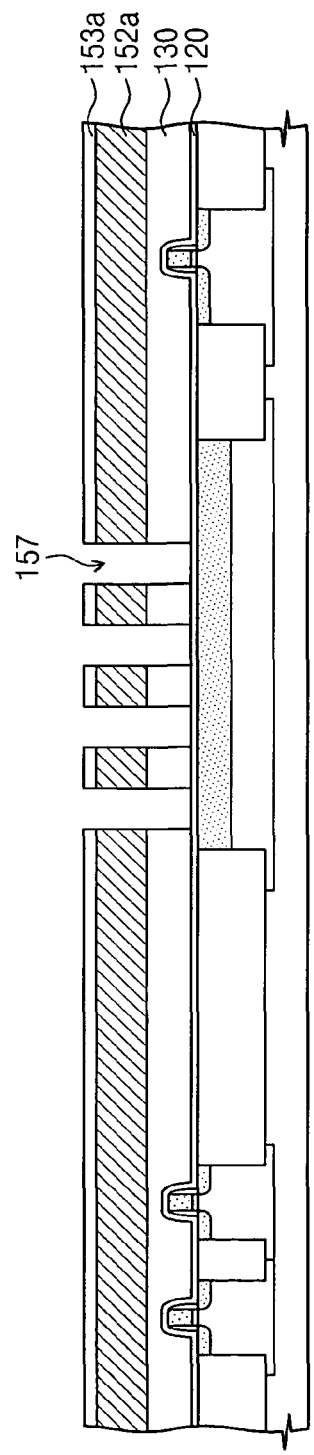
FIGS. 3A through 3P illustrate cross-sectional views of stages in a process of manufacturing a vertical-type semiconductor device according to an embodiment.
Figure 3D:
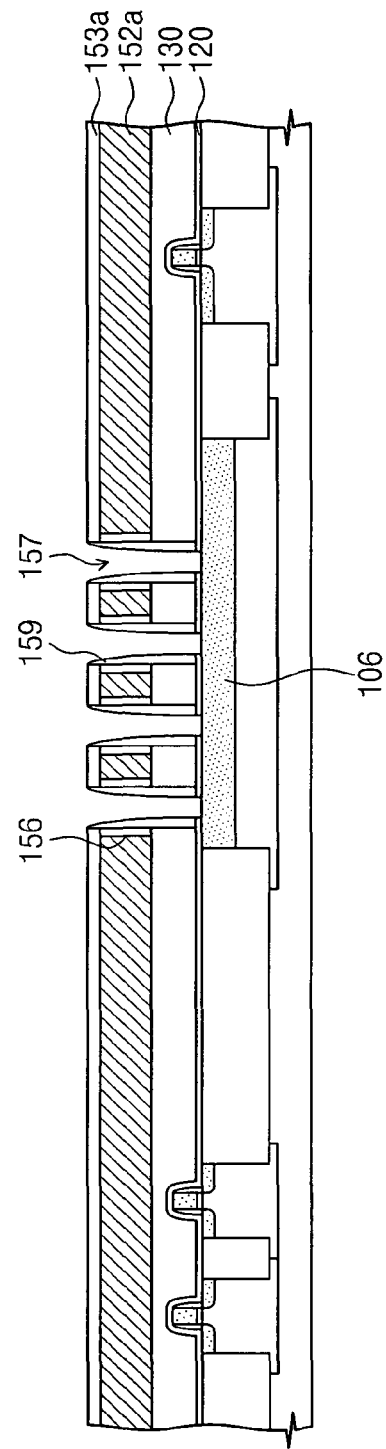
Figure 3E:
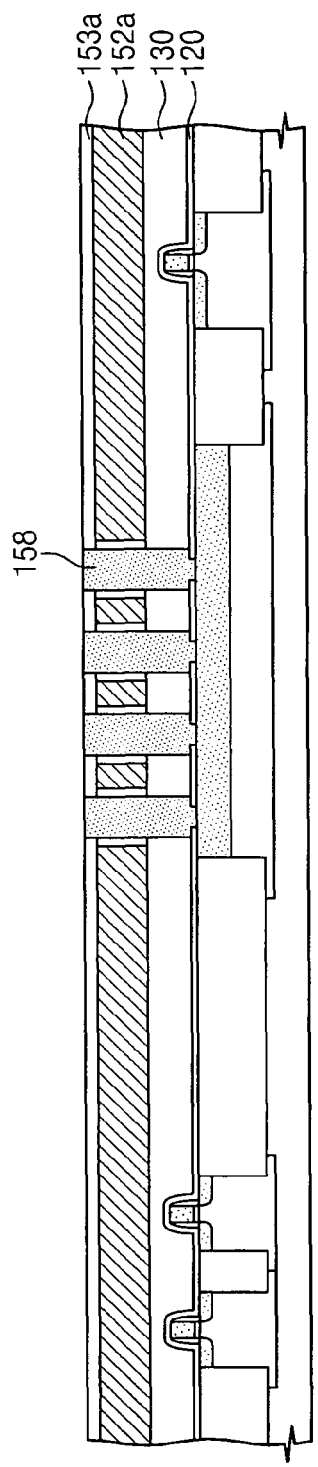
Figure 3F:
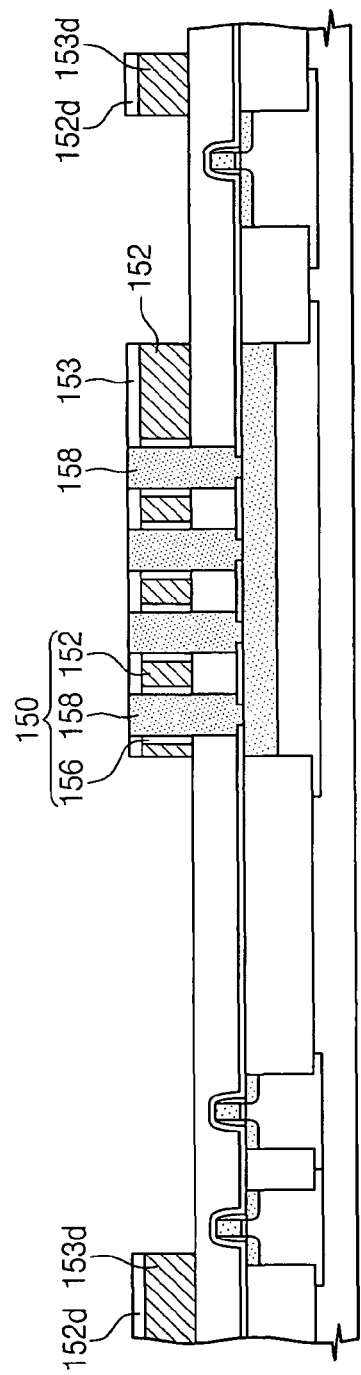
Figure 3G:
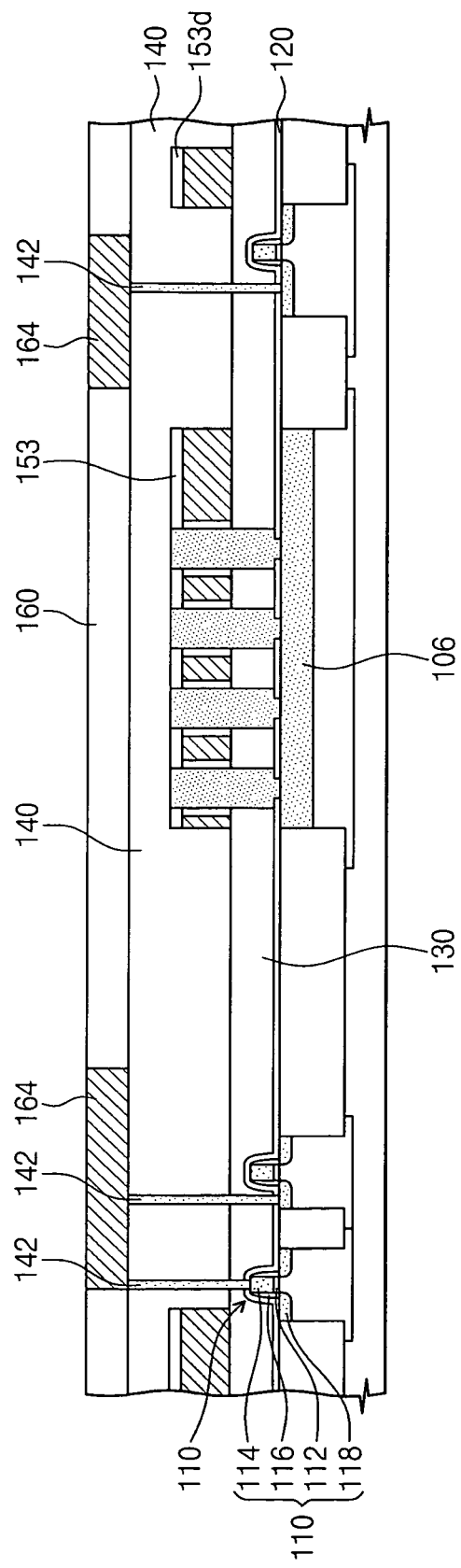
Figure 3H:
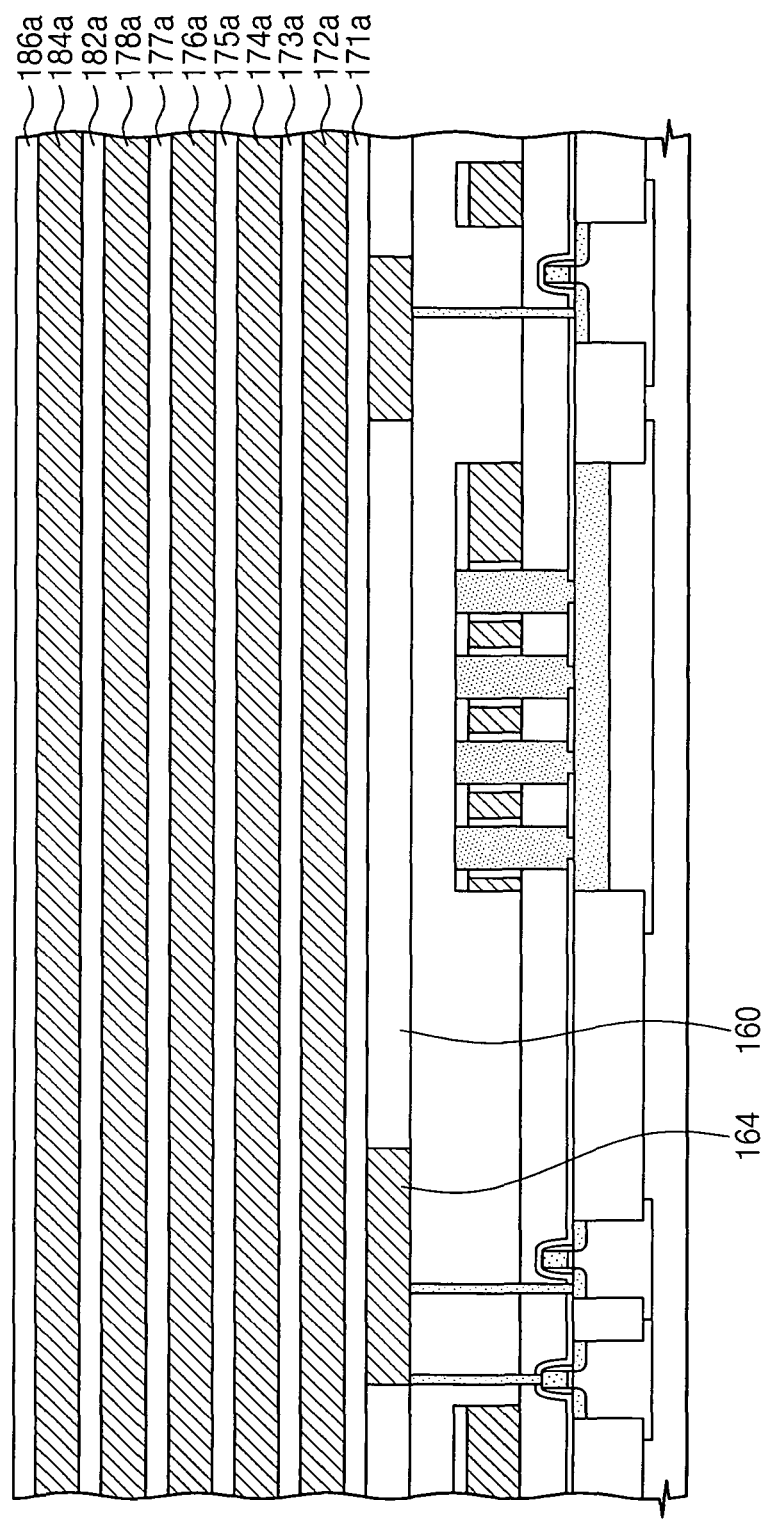
Figure 3I:
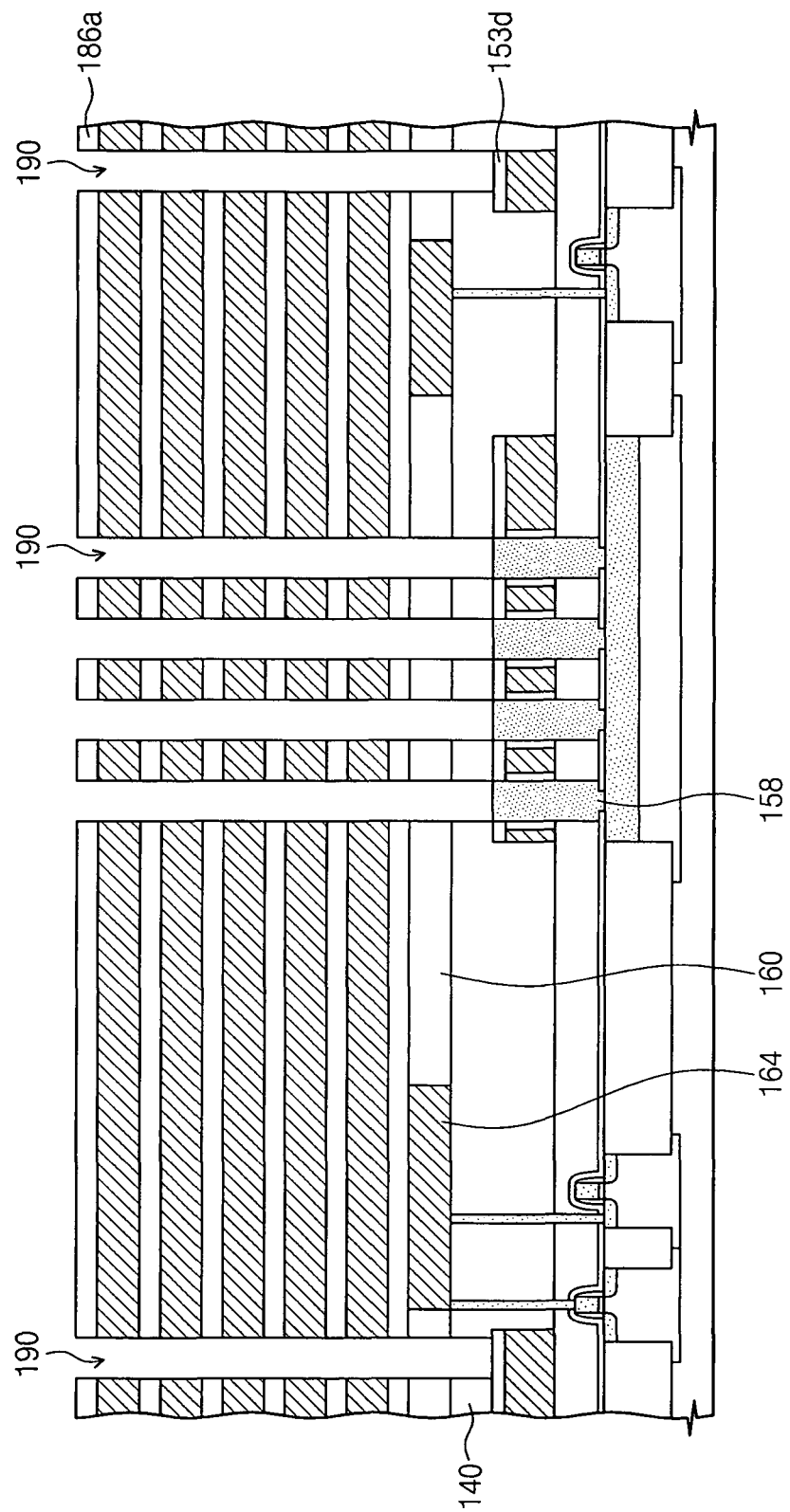
Figure 3J:
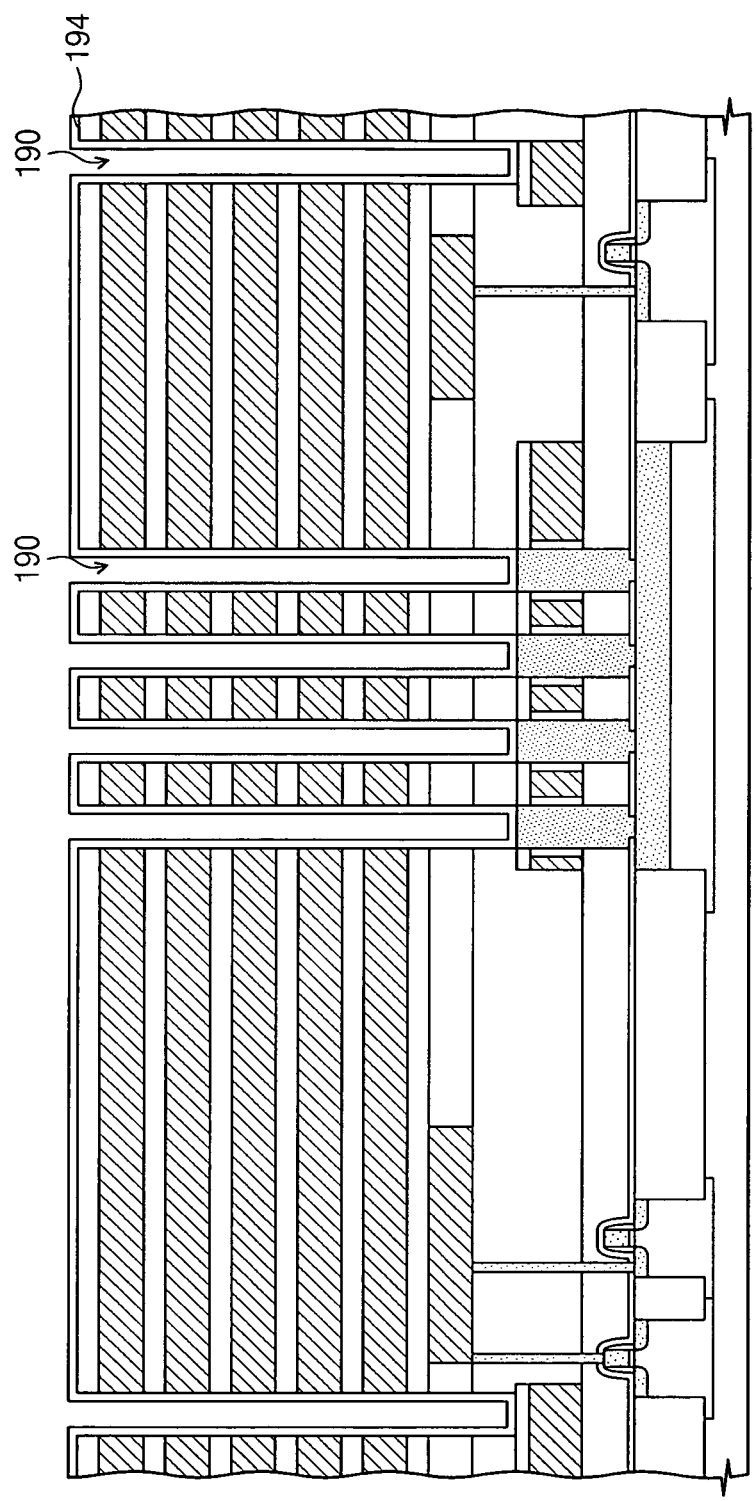
Figure 3K:
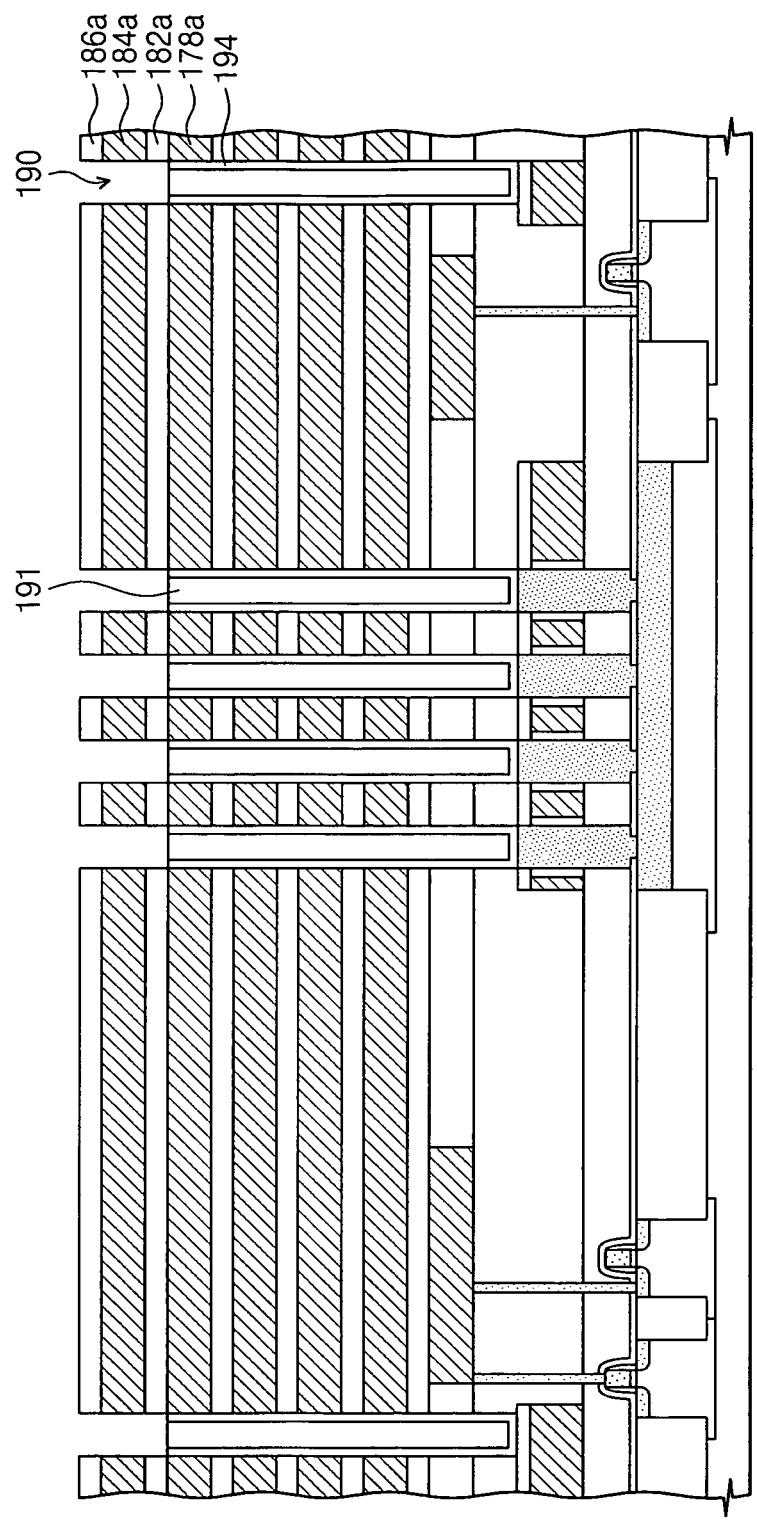
Figure 3L:
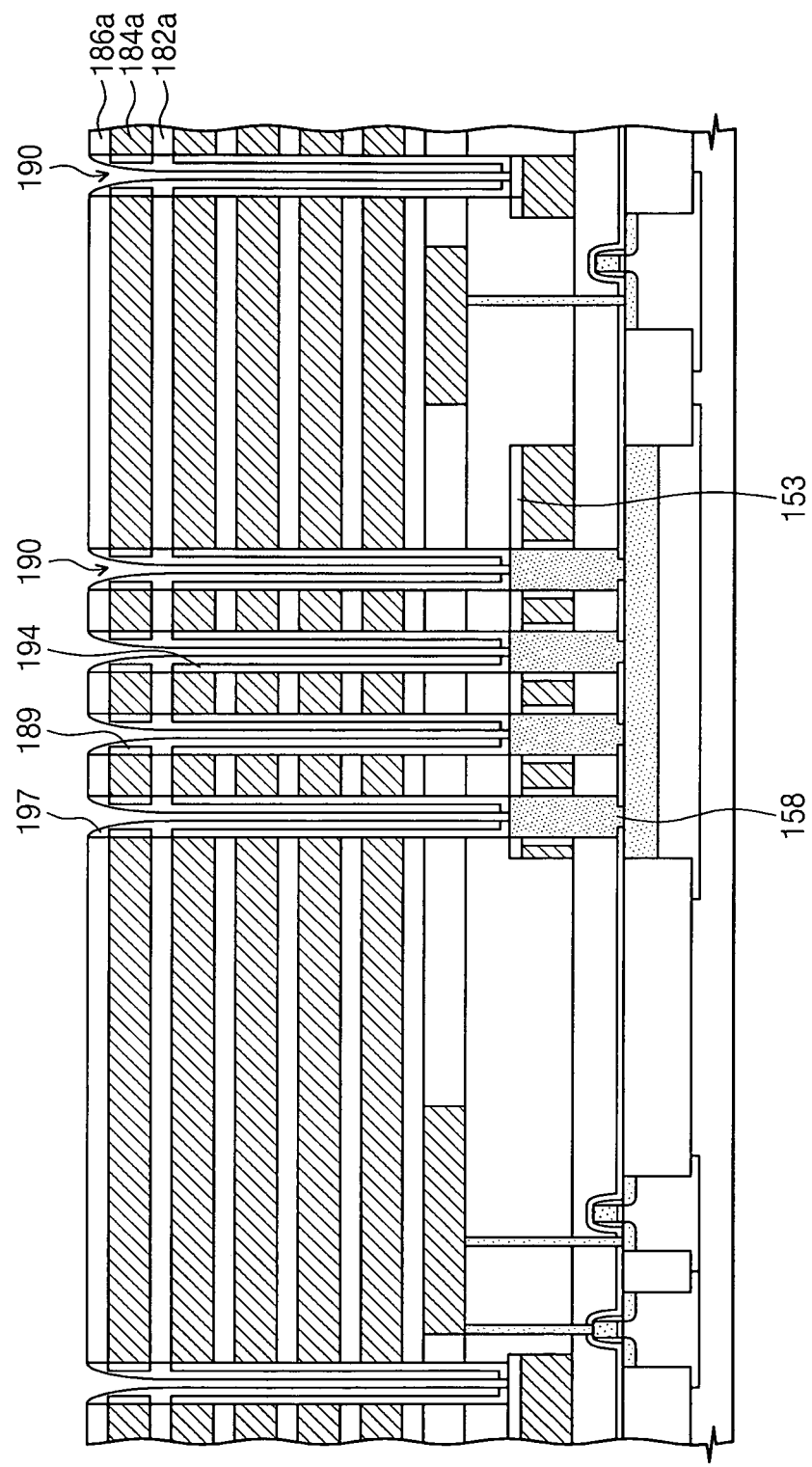
Figure 3M:
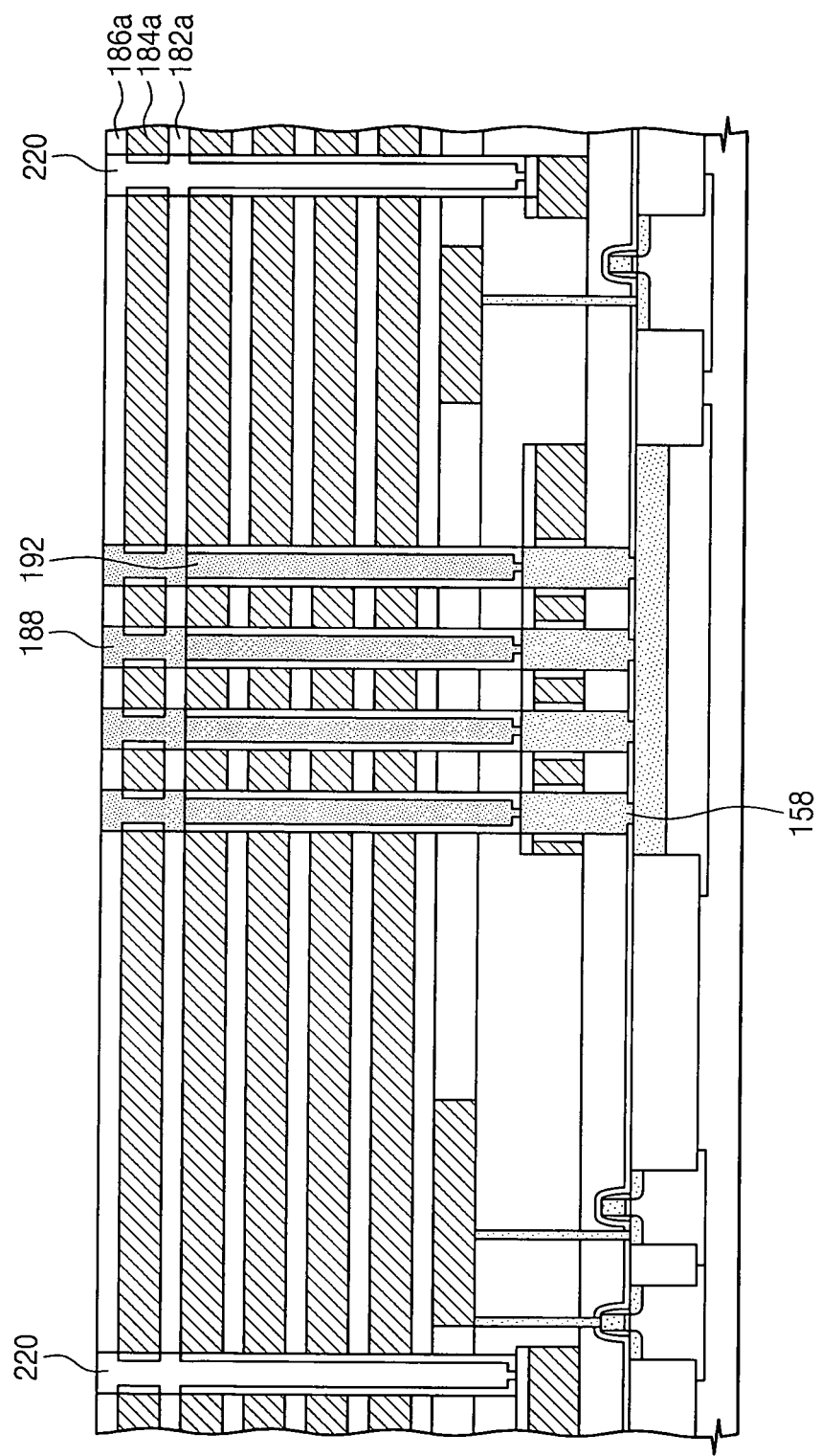
Figure 3N:
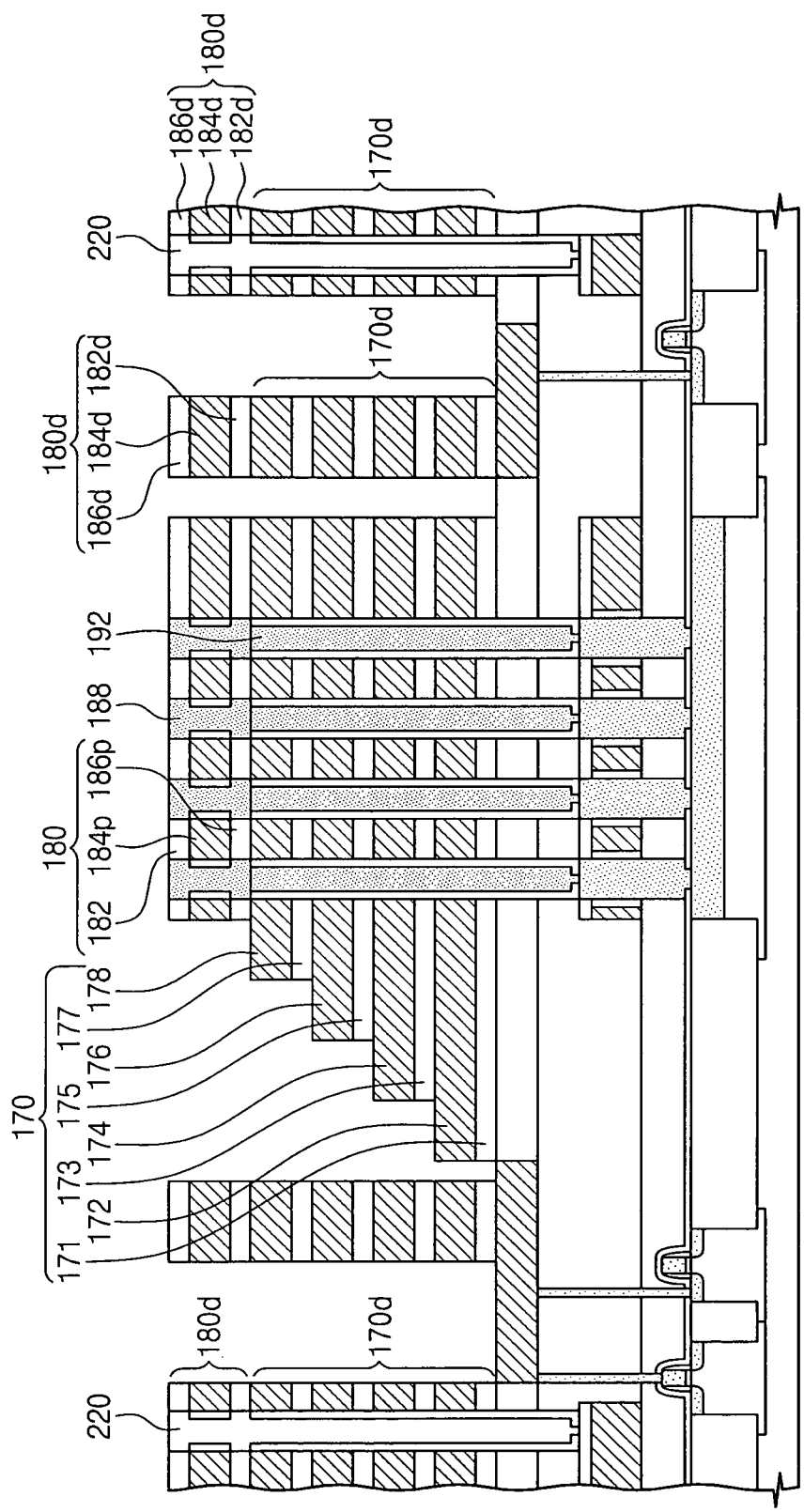
Figure 30:
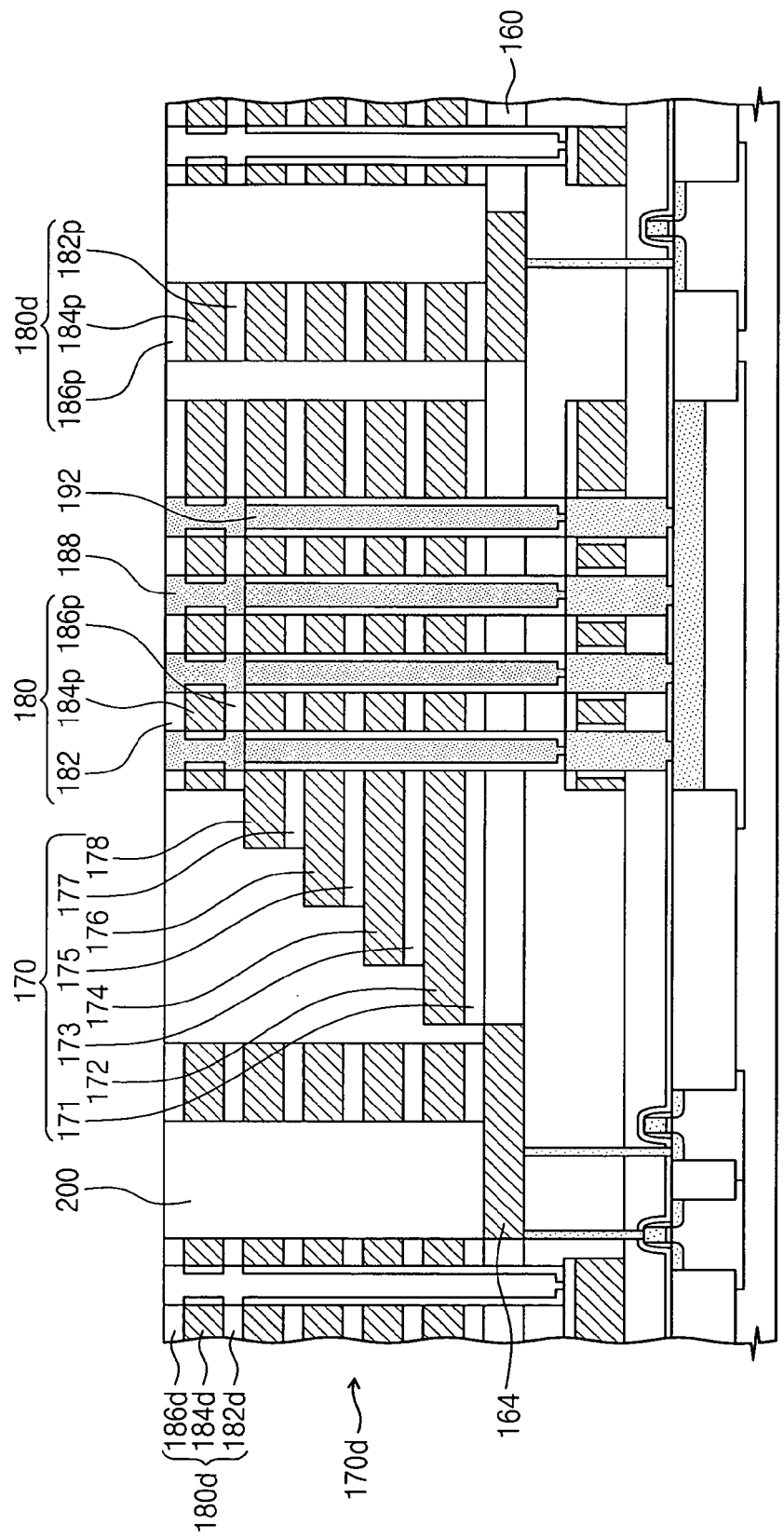
Figure 3P:
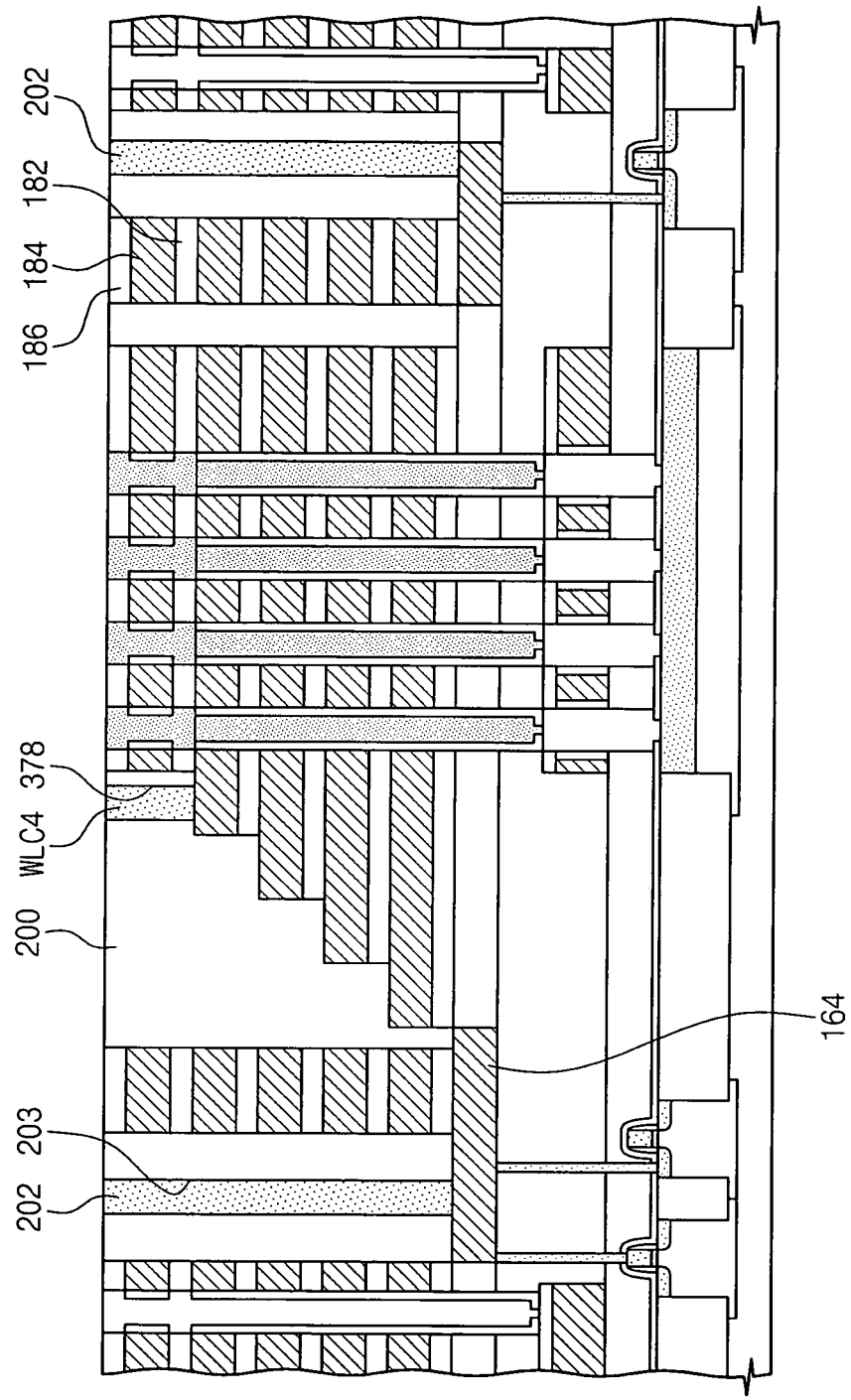

FIGS. 3A through 3P illustrate cross-sectional views of stages in a process of manufacturing a vertical-type semiconductor device according to an embodiment.

Referring to FIG. 3A, a buffer oxide layer (not shown) and a silicon nitride layer (not shown) may be formed on a semiconductor substrate 100. The buffer oxide layer, the silicon nitride layer, and the semiconductor substrate 100 may be sequentially patterned to form a buffer oxide pattern (not shown), a silicon nitride pattern (not shown), and a trench (not shown), respectively. The trench may be filled with a device isolation layer 102 using a plasma-enhanced chemical vapor deposition. The device isolation layer 102 may be planarized to expose the silicon nitride pattern. The silicon nitride pattern and the buffer oxide pattern may be removed. That is, a shallow trench isolation process may be performed to form the device isolation layer 102. The device isolation layer 102 may be formed in a cell region A and a peripheral circuit region B.

A sacrifice oxide layer (not shown) may be formed on the semiconductor substrate 100 and patterned using a photoresist. Then, an ion implantation process may be performed to form the P-well 104 in the cell region A. Also, using the patterning and ion implantation processes, in case of an NMOS, the P-well 108*p* may be formed in the peripheral circuit region B. Alternatively, in case of a PMOS, the N-well 108*n* may be formed in the peripheral circuit region B. The common source region 106 may be formed in the cell region A using the patterning and ion implantation processes. The common source region 106 may be high-concentration-doped with N-type impurities. The common source region 106 may be used as a common source line CSL. The P-well 104 may be joined to the common source region 106 through a PN junction to form a diode.

A peripheral circuit gate dielectric 112 may be disposed on the semiconductor substrate 100. The peripheral circuit gate dielectric 112 may include a silicon oxide layer. The silicon oxide layer may include a thermal oxide layer. The peripheral circuit gate dielectric 112 may include a high-voltage gate dielectric and a low-voltage gate dielectric. The high-voltage gate dielectric may have a thickness greater than that of the low-voltage gate dielectric.

Referring to FIG. 3B, a peripheral circuit gate conductive layer (not shown) may be formed on the peripheral circuit gate dielectric 112. The peripheral circuit gate conductive layer may be formed of doped silicon. The peripheral circuit gate conductive layer may have a multi-layered structure. The multi-layered structure may include a structure of silicon/metal or a structure of silicon/metal silicide. The peripheral circuit gate conductive layer may be patterned to form a peripheral circuit gate electrode 114. A peripheral circuit spacer 116 may be disposed on a lateral surface of the peripheral circuit gate electrode 114, e.g., a silicon nitride layer may be deposited and anisotropically etched to form the peripheral circuit spacer 116. A source/drain region 118 may be formed in the semiconductor substrate 100 of the lateral surface of the peripheral circuit gate electrode 114, e.g., N-type impurities or P-type impurities may be doped to form the source/drain region 118. In case of the NMOS, the source/drain region 118 may be doped with the N-type impurities. In case of the PMOS, the source/drain region 118 may be doped with the P-type impurities. The source/drain region 118 may have a lightly doped drain (LDD) structure.

A peripheral circuit gate structure 110 may include the peripheral circuit gate dielectric 112, the peripheral circuit gate electrode 114, the peripheral circuit spacer 116, and the source/drain region 118. A first etch stop layer 120 may be conformally formed on the peripheral circuit gate structure 110. The first etch stop layer 120 may include a silicon nitride layer or a silicon oxide-nitride layer.

Referring to FIG. 3C, a first interlayer dielectric 130 may be formed on the first etch stop layer 120. The first interlayer dielectric 130 may include a silicon oxide layer. A top surface of the silicon oxide layer may be planarized. A ground select conductive layer 152a may be formed on the first interlayer dielectric 130. A second etch stop layer 153a may be disposed on the ground select conductive layer 152a. The ground select conductive layer 152a may be formed of single crystal silicon or poly crystal silicon. Alternatively, amorphous silicon may be formed, and then a post-process may be performed to form single-crystallized or multi-crystallized ground select conductive layer 152a. The second etch stop layer 153a may include a silicon oxide layer or a silicon oxide-nitride layer.

The second etch stop layer 153a, the ground select conductive layer 152a, and the first interlayer dielectric 130 may be sequentially patterned to form a ground select hole 157. The ground select hole 157 may be two-dimensionally disposed in a matrix shape in the cell region A.

Referring to FIG. 3D, the semiconductor substrate 100 including the ground select hole 157 may be thermally treated to form a ground select gate dielectric 156 on a lateral surface of the ground select hole 157. The ground select gate dielectric 156 may include a silicon oxide layer.

A ground select spacer layer (not shown) may be conformally formed on the semiconductor substrate 100 including the ground select gate dielectric 156. The ground select spacer layer may include a silicon oxide-nitride layer or a silicon layer. The ground select spacer layer may be anisotropically etched to form a ground select spacer 159 on an inner lateral surface of the ground select hole 157. The ground select hole 157 on which the ground select spacer 159 is disposed may be anisotropically etched to remove the first etch stop layer 120 disposed at a lower portion of the ground select hole 157 and to expose the common source region 106.

Referring to FIG. 3E, the ground select spacer 159 may be selectively removed using anisotropic etching. The inside of the ground select hole 157 may be filled with a ground select semiconductor structure 158. The ground select semiconductor structure 158 may be formed using a selective epitaxial growth process. Alternatively, a semiconductor layer may be formed on the semiconductor substrate 100 using a chemical vapor deposition process, and then a planarization process may be performed to form the ground select semiconductor structure 158.

Referring to FIG. 3F, the second etch stop layer 153a and the ground select conductive layer 152a may be patterned to form a second etch stop pattern 153 and a ground select line 152 in the cell region A and to form a second dummy etch stop pattern 153d and a dummy ground select line 152d in the peripheral circuit region B. The second dummy etch stop pattern 153d may have a top surface having the same height as that of a top surface of the second etch stop pattern 153. The second dummy etch stop pattern 153d may be disposed at an outermost portion of the peripheral circuit region B. The ground select line 152 may have a plate shape. The ground select structure 150 may include the ground select line 152, the ground select semiconductor structure 158, and the ground select gate dielectric 156 to constitute the ground select transistor GSTmn.

According to a modified embodiment, the ground select transistor GSTmn may not only be vertically formed on the semiconductor substrate 100, but also may be horizontally formed on the semiconductor substrate 100. In addition, a method of manufacturing a ground select transistor may be variously modified.

Referring to FIG. 3G, a second interlayer dielectric 140 may be formed on the resultant structure including the second dummy etch stop pattern 153d and the second etch stop pattern 153. The second interlayer dielectric 140 may include a silicon oxide layer. A top surface of the second interlayer dielectric 140 may be planarized. A lower interconnection contact hole (not shown) may pass through the second interlayer dielectric 140 and the first interlayer dielectric 130 and be formed on the peripheral circuit gate electrode 114 and/or the source/drain region 118 of the peripheral circuit gate structure 110. A metal layer for filling the lower interconnection contact hole may be formed on the semiconductor substrate 100. Subsequently, the metal layer may be planarized to form the lower interconnection contact plug 142 for filling the lower interconnection contact hole.

Referring again to FIG. 2A, the common source contact plug 107 may pass through the second interlayer dielectric 140 and the first interlayer dielectric 130 and may be disposed on the common source region 106. The common source contact plug 107 may be disposed at an edge portion of the common source region 106. Referring again to FIG. 2A, the ground select contact plug 155 may pass through the second interlayer dielectric 140 and the second etch stop pattern 153 to contact the ground select line 152.

Referring again to FIG. 3G, a lower interconnection layer (not shown) may be formed on the second interlayer dielectric 140 to contact the lower interconnection contact plug 142. The lower interconnection layer may be patterned to form the lower interconnection 164. The third interlayer dielectric 160 may be formed on the resultant structure including the lower interconnection 164. The third interlayer dielectric 160 may include a silicon oxide layer. A top surface of the third interlayer dielectric 160 may be planarized, so the third interlayer dielectric 160 may have a top surface having the same height as that of a top surface of the lower interconnection 164.

Referring to FIG. 3H, a first wordline dielectric 171a, a first wordline conductive layer 172a, a second wordline dielectric 173a, a second wordline conductive layer 174a, a third wordline dielectric 175a, a third wordline conductive layer 176a, a fourth wordline dielectric 177a, and a fourth wordline conductive layer 178a may be sequentially stacked on the third interlayer dielectric 160. The first through fourth wordline conductive layers 172a, 174a, 176a, and 178a may include doped silicon. The first through fourth wordline dielectrics 171a, 173a, 175a, and 177a may include a silicon oxide layer.

A string select dielectric 182a, a string select conductive layer 184a, and a string select capping layer 186a may be sequentially stacked on the fourth wordline conductive layer 178a. The string select dielectric 182a may include a silicon oxide layer. The string select conductive layer 184a may include doped silicon. The string select capping layer 186a may include a silicon nitride layer.

Referring to FIG. 3I, a lower structure below the string select capping layer 186a may be patterned to form a string contact hole 190. The string contact hole 190 may be formed in a matrix shape in the cell region A. The string contact hole 190 may be additionally disposed at the edge portion of the peripheral circuit region B. The string contact hole 190 may pass through the wordline conductive layers 172a, 174a, 176a, and 178a and the wordline dielectrics 171a, 173a, 175a, and 177a. The string contact hole 190 may extend to pass through the third interlayer dielectric 160 and the second interlayer dielectric 140. The string contact hole 190 may expose the ground select semiconductor structure 158 in the cell region A. The string contact hole 190 may be aligned with the ground select semiconductor structure 158, e.g., widths of the string contact hole 190 and ground select semiconductor structure 158 along the first directions may be substantially equal and may entirely overlap each other. The string contact hole 190 may expose the second dummy etch stop pattern 153d in the peripheral circuit region B.

Referring to FIG. 3J, the gate dielectric 194 may be conformally formed on the semiconductor substrate 100 including the string contact hole 190. The gate dielectric 194 may include a charge storage layer. The gate dielectric 194 may have a multi-layered structure of a tunnel insulating layer/charge storage layer/blocking insulating layer. The gate dielectric 194 may have an oxide-nitride-oxide (ONO) multi-layered structure of a silicon oxide layer/silicon nitride layer/silicon oxide layer. The charge storage layer may include a silicon nitride layer. The charge storage layer may trap electric charge. The tunnel insulating layer may include a thermal oxide layer. The structure and material of the gate dielectric 194 may be variously modified.

Referring to FIG. 3K, a photoresist 191 may be formed on the semiconductor substrate 100 including the gate dielectric 194, e.g., to fill the string contact holes 190, and may be etched-back such that a top surface of the photoresist 191 may substantially correspond to that of the fourth wordline conductive layer 178a. Subsequently, the semiconductor substrate 100 may be wet-etched to remove the exposed gate dielectric 194.

Referring to FIG. 3L, the photoresist 191 filled into the string contact hole 190 may be removed. The string select conductive layer 184a may be thermally oxidized to form a string select gate dielectric 189. Subsequently, a string spacer layer (not shown) may be conformally formed on the semiconductor substrate 100. The string spacer layer may include a silicon nitride layer and a silicon oxide-nitride layer or may be formed of silicon. The string spacer layer may be anisotropically etched to form a string spacer 197 on a lateral surface of the string contact hole 190. The string spacer 197 may expose a portion of the gate dielectric 194. That is, the string spacer 197 and the string select capping layer 186a may be etched using a mask to remove at least a portion of the gate dielectric 194 disposed on the ground select semiconductor structure 158. As a result, a portion of the ground select semiconductor structure 158 may be exposed.

Referring to FIG. 3M, the string spacer 197 may be selectively removed using anisotropic etching. An epitaxial growth process may be performed on the exposed ground select semiconductor structure 158 of the cell region A to grow the semiconductor structure 192 in a pillar shape. The semiconductor structure 192 may be formed of doped or undoped silicon. The semiconductor structure 192 may extend to fill the string contact hole 190. Subsequently, the semiconductor substrate 100 including the semiconductor structure 192 may be planarized. An upper portion of the semiconductor structure 192 may constitute a string select semiconductor structure 188.

The ground select semiconductor structure 158 may not be disposed at a lower portion of the string contact hole 190 of the peripheral circuit region B. Thus, when the selective epitaxial growth process is performed, a semiconductor structure 192 may not be formed in the string contact hole 190 of the peripheral circuit region B. A dampproofing layer (not shown) may be formed on the semiconductor substrate 100 to fill the string contact hole 190 of the peripheral circuit region B. The semiconductor substrate 100 including the dampproofing layer may be planarized to form the dampproofing structure 220 in the string contact hole 190 of the peripheral circuit region B. The dampproofing layer may include at least one of a silicon nitride layer, a silicon oxide-nitride layer, and a polyimide layer. The dampproofing structure 220 may prevent or substantially minimize introduction of contaminating materials or moisture from an exterior of a chip into the peripheral circuit region B.

According to a modified embodiment, a semiconductor layer (not shown) may be deposited on the semiconductor substrate 100 in which the ground select semiconductor structure 158 of the lower portion of the string contact hole 190 is exposed. The semiconductor layer may be formed of poly-silicon or amorphous silicon. Subsequently, the semiconductor layer may be crystallized using a thermal treating process. A wet etch process may be performed to remove the semiconductor layer formed in the string contact hole 190 of the peripheral circuit region B. The string contact hole 190 of the peripheral circuit region B may be filled with the dampproofing structure 220. The dampproofing structure 220 may include a silicon-nitride layer.

According to another modified embodiment, a semiconductor layer (not shown) may be deposited on the semiconductor substrate 100 in which the ground select semiconductor structure 158 of the lower portion of the string contact hole 190 is exposed. The semiconductor layer may be conformally deposited on a sidewall of the string contact hole 190. Subsequently, the string contact hole 190 may be filled with a dampproofing layer. The dampproofing layer may include a silicon nitride layer. The semiconductor substrate including the dampproofing layer may be planarized to expose the string select capping layer 186a to form a dampproofing structure 220 filling the string contact hole 190.

Referring to FIG. 3N, a structure below the string select capping layer 186a may be patterned to form the string select line structure 180, dummy string select line structure 180d, wordline structure 170, and dummy wordline structure 170d. The patterning process may be performed using a plurality of masks.

The wordline structure 170 may include the first wordline dielectric pattern 171, first wordline 172, second wordline dielectric pattern 173, second wordline 174, third wordline dielectric pattern 175, third wordline 176, fourth wordline dielectric pattern 177, and fourth wordline 178. The string select line structure 180 may be disposed on the wordline structure 170. The string select line structure 180 may include the string select dielectric pattern 182, a preliminary string select line 184p, and a preliminary string select capping pattern 186p. Lateral surfaces of the string select dielectric pattern 182, the preliminary string select line 184p, and the preliminary string select capping pattern 186p may be aligned with each other.

The first through fourth wordline dielectric patterns 171, 173, 175, and 177 and the first through fourth wordlines 172, 174, 176, and 178 may be aligned at a stepped portion of the wordline structure 170, respectively. The string select line structure 180 and the wordline structure 170 may be sequentially formed in a stepped shape at the stepped portion.

The dummy wordline structure 170d may have a vertical structure equal to that of the wordline structure 170, and may be in the peripheral circuit region B. However, the dummy wordline structure 170d may do not have the stepped shape. In other words, lateral surfaces of the dummy string select line structure 180d and the dummy wordline structure 170d may be aligned with each other.

Referring to FIG. 3O, the fourth interlayer dielectric 200 may be formed, e.g., of silicon oxide, on the semiconductor substrate 100. In particular, the fourth interlayer dielectric 200 may be disposed on the third interlayer dielectric 160 and on the lower interconnection 164 to fill spaces between vertical structures of the wordline structure 170, string select line structure 180, dummy wordline structure 170d, and dummy string select line structure 180d. The fourth interlayer dielectric 200 may be planarized to expose the preliminary string select capping pattern 186p. Since the dummy wordline structure 170d and/or the dummy string select line structure 180d extend to a substantially same height as the wordline structure 170 and/or the string select line structure 180, respectively, the planarized fourth interlayer dielectric 200 may have a substantially uniform and planar top surface.

In contrast, when an interlayer dielectric is planarized in a conventional semiconductor device, e.g., without a dummy wordline structure in the peripheral circuit region, a height difference between a cell region and a peripheral circuit region may occur. According to example embodiments, however, the dummy wordline structure 170d and the dummy string select line structure 180d may serve as dummy patterns to uniformly maintain a substantially level top surface of the fourth interlayer dielectric 200 in the peripheral circuit region B and the cell region A. Therefore, electrical interconnections on the fourth interlayer dielectric 200 that connect the peripheral circuit region B and the cell region A may be improved and exhibit higher operability and reliability.

Referring to FIG. 3P, the preliminary string select capping pattern 186p and preliminary string select line 184p may be patterned to form the string select capping pattern 186 and the string select line 184, which extend in the first direction. The fifth interlayer dielectric (not shown) may be formed on the semiconductor substrate 100 including the string select line 184, and may be planarized to expose the string select capping pattern 186.

Referring again to FIGS. 2A and 3P, the fourth interlayer dielectric 200 may be patterned to form a first wordline contact hole (not shown) for exposing the first wordline 172, a second wordline contact hole (not shown) for exposing the second wordline 174, a third wordline contact hole (not shown) for exposing the third wordline 176, and a fourth wordline contact hole 378 for exposing the fourth wordline 178. An upper interconnection contact hole for exposing the lower interconnection 164 may be formed in the peripheral circuit region B. A metal layer may be formed to fill the first through fourth wordline contact holes and the upper interconnection contact hole. The metal layer may be planarized to expose the fourth interlayer dielectric 200, thereby forming first through fourth wordline contact plugs WLC1 through WLC4 and the upper interconnection contact plug 202.

Referring again to FIG. 2B, a bit conductive layer (not shown) may be formed on the semiconductor substrate 100 including the first through fourth wordline contact plugs WLC1 through WLC4. The bit conductive layer may be patterned to form the bitline BL connecting the string select semiconductor structure 188 or the semiconductor structure 192 to the cell region A in the second direction. Also, the upper pad 203 connecting the upper interconnection contact plug 202 to the peripheral circuit region B may be formed.

The sixth interlayer dielectric 230 may be formed on the semiconductor substrate 100 including the bitline BL. The sixth interlayer dielectric 230 and the string select capping pattern 186 may be patterned to form a string select contact hole (not shown). Also, a metal layer may be formed to fill the string contact hole. In addition, the metal layer may be planarized to form the string select contact plug 204. The string select contact plug 204 may be connected the upper interconnection 212.

Figure 4:
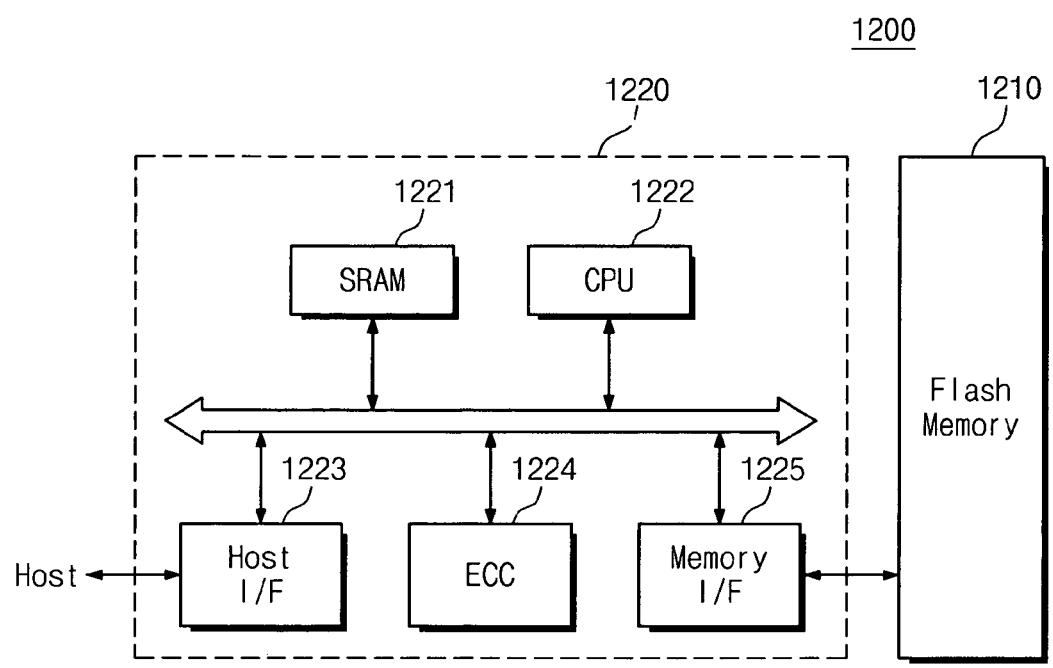
FIG. 4 illustrates a block diagram of a memory card including a vertical-type semiconductor device according to an embodiment.

FIG. 4 illustrates a block diagram of a memory card 1200 including a flash memory according to an embodiment.

Referring to FIG. 4, the memory card 1200 for supporting high capacity data storage ability may include a flash memory device 1210 according to an embodiment. The memory card 1200 may further include a memory controller 1220 for controlling general data exchanges between a host and the flash memory device 1210.

A SRAM 1221 may be used as an operating memory of a central processing unit (CPU) 1222. A host interface (I/F) 1223 may include a data exchange protocol of the host connected to the memory card 1200. An error correction code (ECC) 1224 may detect and correct errors in data read from the multi-bit flash memory device 1210. A memory I/F 1225 may interface with the flash memory device 1210. The CPU 1222 may perform general control operations for data exchanges of the memory controller 1220. Although not shown, it is apparent to those skilled in the art that the memory card 1200 may further include ROM (not shown) for storing code data in order to interface with the host.

As described above, as the flash memory device 1210 may have a structure of a semiconductor device according to embodiments, the flash memory device 1210 may include a dummy wordline structure that improves reliability and operability of the flash memory device 1210 in the memory card 1200 or in other suitable memory systems. For example, a more reliable memory system may be provided through the flash memory device 1210 having the improved erasing characteristic of dummy cells. Especially, the flash memory device 1210, e.g., a solid state disk (SSD), may be provided in the memory system. In this case, errors caused from dummy cells may be prevented to realize a highly reliable memory system.

Figure 5:
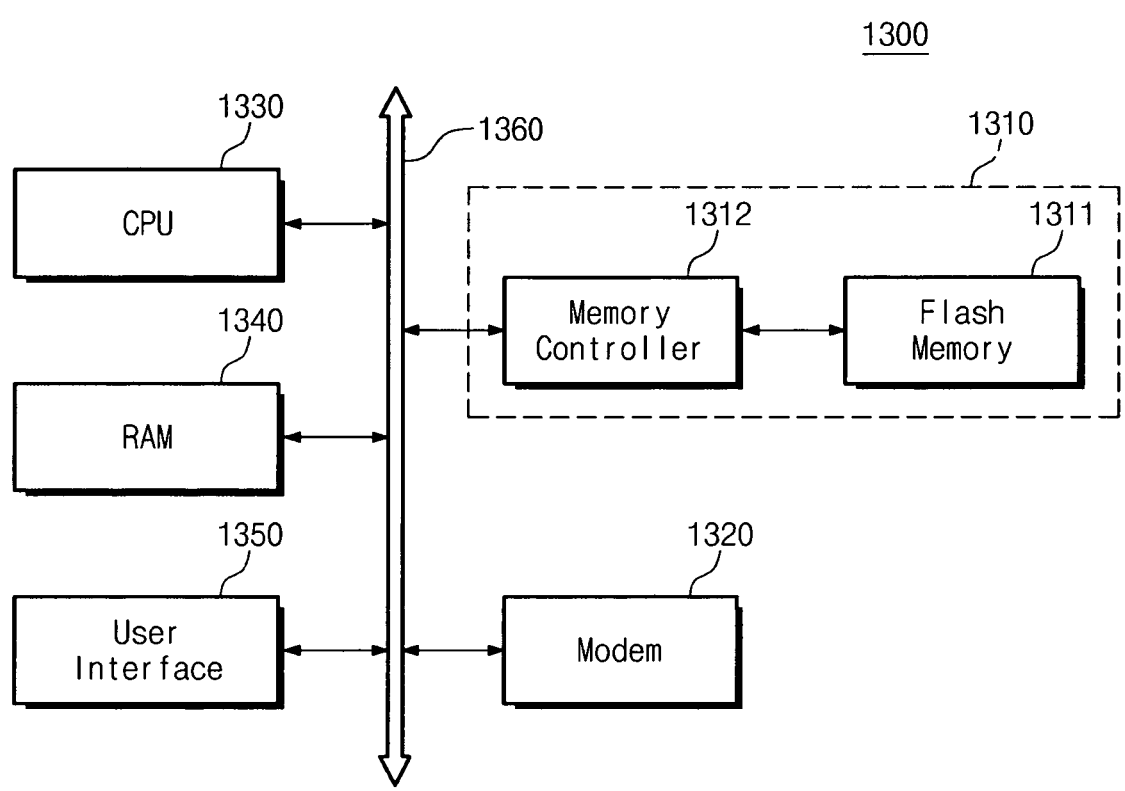
FIG. 5 illustrates a block diagram of an information processing system including a vertical-type semiconductor device according to an embodiment.

FIG. 5 illustrates a block diagram of an information processing system 1300 including a flash memory system 1310 according to an embodiment.

Referring to FIG. 5, the flash memory system 1310 may be mounted in the information processing system 1310, e.g., a mobile device or a desktop computer. The information processing system 1300 may include a modem 1320 connected to the flash memory system 1310 via a system bus 1360, CPU 1330, a RAM 1340, and a user interface 1350. The flash memory system 1310 may substantially have the same configuration as the above-mentioned memory system or flash memory system 1210. The flash memory system 1310 may store data processed by the CPU 1330 or data input from the external. Here, the flash memory system 1310 may include, e.g., a SSD. In this case, the information process system 1300 may stably store high capacity data in the flash memory system 1310. As its reliability is increased, the flash memory system 1310 may save minimize resources used for an error correction process, and thus, provide a high speed of data exchange function to the information processing system 1300. Although not shown, it is apparent to those skilled in the art that the information processing system 1300 may further include, e.g., an application chipset, a camera image processor (CIS), and an input/output device.

The flash memory device or the memory system according to embodiments may be mounted using various kinds of packages. Examples of the various packages may include package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline (SOIC), shrink small outline package (SSOP), thin small outline (TSOP), thin quad flatpack (TQFP), system in package (SIP), multi chip package (MCP), wafer-level fabricated package (WFP), wafer-level processed stack package (WSP), etc.

It is noted that examples of realizing three-dimensional memory semiconductor devices, i.e., vertical semiconductor pillars in an active cell region, may include Japanese Patent Laid-Open Publication No. Hei 6-338602, titled "Semiconductor memory device and method of manufacturing the same," U.S. Patent Application Publication No. 20070252201, titled "Nonvolatile Semiconductor Memory Device and Manufacturing Method Thereof," a paper titled "Optimal Integration and Characteristics of Vertical Array Devices for Ultra-High Density, Bit-Cost Scalable Flash Memory" by Y. Fukuzumi, etc. (Electron Device Meeting, 2007. IEDM 2007. IEEE International, pp. 449-452), and a paper titled "Bit Cost Scalable Technology with Punch and Plug Process for Ultra High Density Flash Memory" by H. Tanaka, etc. (VLSI Technology, 2007 IEEE Symposium on, pp. 14-15). The above publications are incorporated herein by reference in their entirety.

A vertical-type semiconductor device according to an embodiment may include a dummy wordline structure in a peripheral circuit region. The dummy wordline structure in the peripheral circuit region may extend to a substantially same height as a wordline structure in a cell region, so a planarized dielectric layer thereon may have a substantially planar structure, i.e., without a height difference between the cell region and the peripheral circuit region. Further, a dampproofing structure may be formed in the dummy wordline structure, so introduction of contaminating materials or moisture from an exterior of the semiconductor device may be prevented or substantially minimized. In addition, as a method of forming the semiconductor device according to an embodiment employs a process for simultaneously forming a plurality of vertical semiconductor structures passing through a plurality of vertically stacked wordlines, as opposed to repeating formation of a plurality of planar memory cells, manufacturing costs per bit may be significantly reduced.

Exemplary embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A vertical-type semiconductor device, comprising:
a semiconductor substrate having a cell region and a peripheral circuit region;
a wordline structure on the cell region of the semiconductor substrate, the wordline structure including a plurality of wordlines stacked on top of each other;
a semiconductor structure through the wordline structure;
a gate dielectric between the wordline structure and the semiconductor structure; and
a dummy wordline structure on the peripheral circuit region, the dummy wordline structure having a vertical structure and including same components as the wordline structure.

2. The vertical-type semiconductor device as claimed in claim 1, wherein top surfaces of the dummy wordline structure and the wordline structure are substantially level.

3. The vertical-type semiconductor device as claimed in claim 2, wherein the dummy wordline structure and the wordline structure have a substantially same height along a vertical direction.

4. The vertical-type semiconductor device as claimed in claim 1, wherein the dummy wordline structure surrounds the cell region.

5. The vertical-type semiconductor device as claimed in claim 1, further comprising a dampproofing structure in the dummy wordline structure.

6. The vertical-type semiconductor device as claimed in claim 5, wherein the dampproofing structure is within a through hole, the through hole passing vertically through the dummy wordline structure.

7. The vertical-type semiconductor device as claimed in claim 5, wherein the dampproofing structure extends through an entire height of the dummy wordline structure.

8. The vertical-type semiconductor device as claimed in claim 7, wherein the dampproofing structure surrounds the cell region.

9. The vertical-type semiconductor device as claimed in claim 5, wherein the dampproofing structure includes a silicon nitride layer.

10. The vertical-type semiconductor device as claimed in claim 1, further comprising:
a string select line structure on the wordline structure; and
a dummy string select line structure on the dummy wordline structure, top surfaces of the string select line structure and dummy string select line structure being substantially level.

11. The vertical-type semiconductor device as claimed in claim 1, wherein the dummy wordline structure is disposed at an edge portion of the peripheral circuit region farthest from the cell region.

12. The vertical-type semiconductor device as claimed in claim 1, further comprising a ground select structure between the wordline structure and the semiconductor substrate.

13. The vertical-type semiconductor device as claimed in claim 1, wherein the wordline structure has a stepped shape.

14. The vertical-type semiconductor device as claimed in claim 1, wherein the wordline structure, the semiconductor structure, and the gate dielectric define a vertical-type NAND flash memory connected in series.

15. A method for manufacturing a vertical-type semiconductor device, the method comprising:
- forming a wordline structure on a cell region of a semiconductor substrate, the wordline structure including a plurality of wordlines stacked on top of each other;
- forming a semiconductor structure through the wordline structure;
- forming a gate dielectric between the wordline structure and the semiconductor structure; and
- forming a dummy wordline structure on a peripheral circuit region of the semiconductor substrate, the dummy wordline structure having a vertical structure and including same components as the wordline structure.

16. The method as claimed in claim 15, further comprising:
- forming a plurality of stacked wordline conductive layers in the cell region and peripheral circuit region of the semiconductor substrate;
- patterning the wordline conductive layers of the cell region to form the wordline structure; and
- patterning the wordline conductive layers of the peripheral circuit region to form the dummy wordline structure, such that top surfaces of the dummy wordline structure and the wordline structure are substantially level.

17. The method as claimed in claim 15, further comprising forming a dampproofing structure through the dummy wordline structure.

18. The method as claimed in claim 17, wherein the dampproofing structure is formed of a silicon nitride layer.

* * * * *